US009281254B2

(12) United States Patent
Yu et al.

(10) Patent No.: US 9,281,254 B2
(45) Date of Patent: Mar. 8, 2016

(54) METHODS OF FORMING INTEGRATED CIRCUIT PACKAGE

(71) Applicant: Taiwan Semiconductor Manufacturing Company, Ltd., Hsin-Chu (TW)

(72) Inventors: Chen-Hua Yu, Hsin-Chu (TW); Chi-Hsi Wu, Hsin-Chu (TW); Wen-Chih Chiou, Zhunan Township (TW); Hsiang-Fan Lee, Hsin-Chu (TW); Shih-Peng Tai, Xinpu Township (TW); Tang-Jung Chiu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/298,711

(22) Filed: Jun. 6, 2014

(65) Prior Publication Data

US 2015/0228550 A1 Aug. 13, 2015

Related U.S. Application Data

(60) Provisional application No. 61/939,562, filed on Feb. 13, 2014.

(51) Int. Cl.

| | |
|---|---|
| ***G01R 31/26*** | (2014.01) |
| ***H01L 21/66*** | (2006.01) |
| ***H01L 21/78*** | (2006.01) |
| ***H01L 23/00*** | (2006.01) |

(52) U.S. Cl.

CPC ................ *H01L 22/32* (2013.01); *H01L 21/78* (2013.01); *H01L 22/14* (2013.01); *H01L 22/20* (2013.01); *H01L 24/09* (2013.01); *H01L 24/81* (2013.01); *H01L 2224/09515* (2013.01); *H01L 2224/81007* (2013.01); *H01L 2924/181* (2013.01)

(58) Field of Classification Search

CPC ... H01L 22/14; H01L 21/76898; H01L 21/78; H01L 24/09; H01L 24/89; H01L 25/0657; H01L 23/481; H01L 23/5226; H01L 21/6835; H01L 21/6836

USPC ............................ 257/48; 438/11, 14, 15, 18

See application file for complete search history.

(56) References Cited

U.S. PATENT DOCUMENTS

2011/0304349 A1* 12/2011 Stillman ............ G01R 31/2886 324/756.02
2014/0179032 A1* 6/2014 Hasebe ................... H01L 22/14 438/15
2014/0264337 A1* 9/2014 Chen ....................... H01L 24/49 257/48

* cited by examiner

*Primary Examiner* — Dung Le
(74) *Attorney, Agent, or Firm* — Slater & Matsil, L.L.P.

(57) ABSTRACT

A method for forming integrated circuit packages is presented. A first plurality of first tier stacks are mounted to the substrate, wherein the substrate has one or more contact pads corresponding to each of the first tier stacks and has one or more probing pads associated with each of the first tier stacks. Each of the first tier stacks is electrically tested to identify known good first tier stacks and known bad first tier stacks. A first plurality of stacking substrates are mounted to the known good first tier stacks, thereby forming a plurality of second tier stacks. Each of the second tier stacks is electrically tested to identify known good second tier stacks and known bad second tier stacks.

20 Claims, 28 Drawing Sheets

115
117
201
301
401
403
409
405
407
103
101
209 211 209 209 211 209 209 211 209 209 211 209

METHODS OF FORMING INTEGRATED CIRCUIT PACKAGE

PRIORITY CLAIM AND CROSS-REFERENCE

The present application claims priority to U.S. Provisional Application Ser. No. 61/939,562, entitled "Probe Pad Structure and Methods of Using Same," filed on Feb. 13, 2014, which application is hereby incorporated by reference herein in its entirety.

BACKGROUND

The continuous growth of the semiconductor industry is partly due to the constant improvements in the integration density of electronic components (i.e., transistors, diodes, resistors, capacitors, etc.) by reducing their physical sizes to allow for a greater number of components to be placed in a given chip area. Some improvements are two-dimensional (2D) in nature in that the devices are fabricated on the surface of a semiconductor wafer.

Another method of increasing device density is to stack dies on top of one another and interconnect or route them through connections such as through vias (TVs). Such a configuration is named a three-dimensional integrated circuit (3DIC). Some of the benefits of 3DIC, for example, include exhibiting a smaller footprint, reducing power consumption by reducing the lengths of signal interconnects, and improving yield and fabrication cost if individual dies are tested separately prior to assembly.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
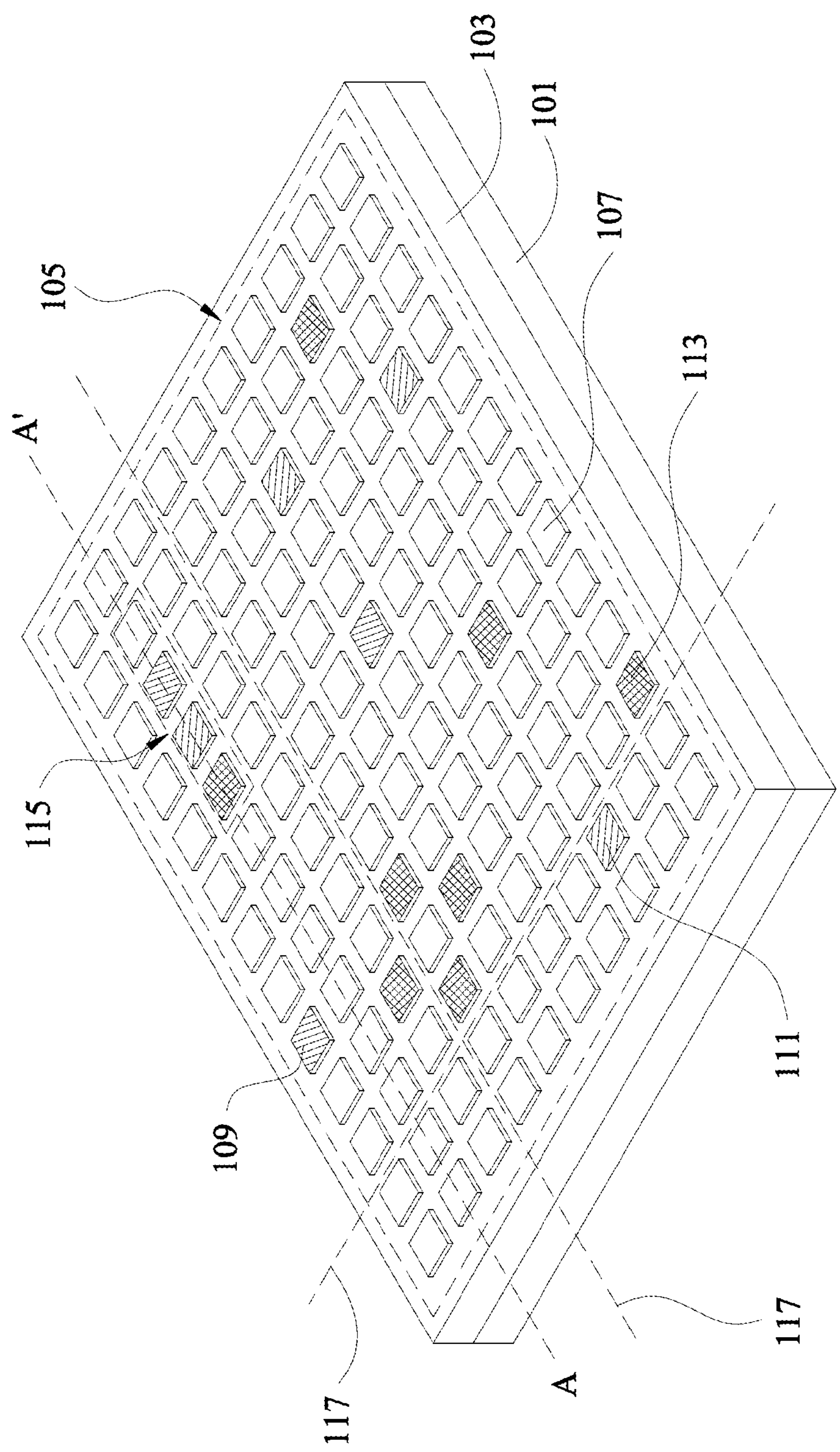
FIG. 1A is a three-dimensional view illustrating integrated circuit packages formed on a substrate on panel (SoP) in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A structure of an integrated circuit package and methods of forming the same are provided. In particular, integrated circuit packages with embedded probing pads are described in greater detail below. In addition, methods of forming integrated circuit packages that are utilizing embedded probing pads are also provided below.

Before addressing illustrated embodiments specifically, advantageous features and certain aspects of the exemplary embodiments are discussed generally. General aspects of embodiments described herein include probing pads designed on a front side of a substrate (e.g., a side upon which stacking substrates are mounted to the substrate). As described below in greater detail below, the stacking substrates may be integrated circuit dies, interposers, and the like. Another general aspect is that electronic testing, so-called E-test, can be applied during a packaging process, such as after each stacking step for stacking multiple stacking substrates, an E-test can be performed. In this way, known bad dies (KBDs) and/or known bad interposers (KBIs) can be identified and re-worked, replaced, removed, discarded, flagged or otherwise accounted for during the packaging process. Another general aspect of the following embodiments is that further processing/stacking of additional stacking substrates can be limited to only known good dies (KGDs) and/or known good interposers (KGIs), thus reducing manufacturing cost and improving overall yield. In what follows, an integrated circuit package will be referred simply as a package.

Turning now to the illustrated embodiments, FIG. 1A is a three-dimensional view illustrating the packages 105 formed on the substrate 103 placed on the carrier 101 in accordance with some embodiments. The substrate 103 may be attached to the carrier 101 using, for example, an adhesive layer (not shown), or the like. In some embodiments, the carrier 101 provides structural support for layers formed thereon, and may represent a printed circuit board (PCB), a jig, and the like. The carrier 101 may be fabricated from, for example, a polymer material, a ceramic material, silicon, quartz, glass, metal, or the like.

In some embodiments, the substrate 103 provides a structural base as well as an electrical interface for the packages 105. For example, the substrate 103 may be a laminated substrate, a silicon interposer, a glass interposer, or the like. In some embodiments, the substrate 103 may comprise multiple conductive layers (not individually illustrated), some of which are inter-layers within the substrate 103. These layers may be etched into traces of various widths and lengths and connected through inter-layer vias. Together, the lines and vias may form an electrical network to route power, ground, and signals from a top surface of the substrate 103 to a bottom surface of the substrate 103. The substrate 103 may be fabricated from, for example, silicon, an organic (laminate) material such as bismaleimide-triazine (BT), a polymer-based material such as liquid-crystal polymer (LCP), a ceramic material such as low-temperature co-fired ceramic (LTCC), or the like. The conductive layers and vias of the substrate 103 may be formed from any suitable conductive material, such as copper, aluminum, silver, gold, other metals, alloys, combination thereof, and/or the like, and formed by any suitable technique, such as electro-chemical plating (ECP), electroless plating, other deposition methods such as sputtering, printing, chemical vapor deposition (CVD) methods, or the like. In some embodiments, the substrate 103 comprises electrical elements, such as resistors, capacitors, signal redistribution circuitry, combinations of these, or the like. These electrical elements may be active, passive, or a combination thereof. In other embodiments, the substrate 103 is free from both active and passive electrical elements therein.

Figure 1B:
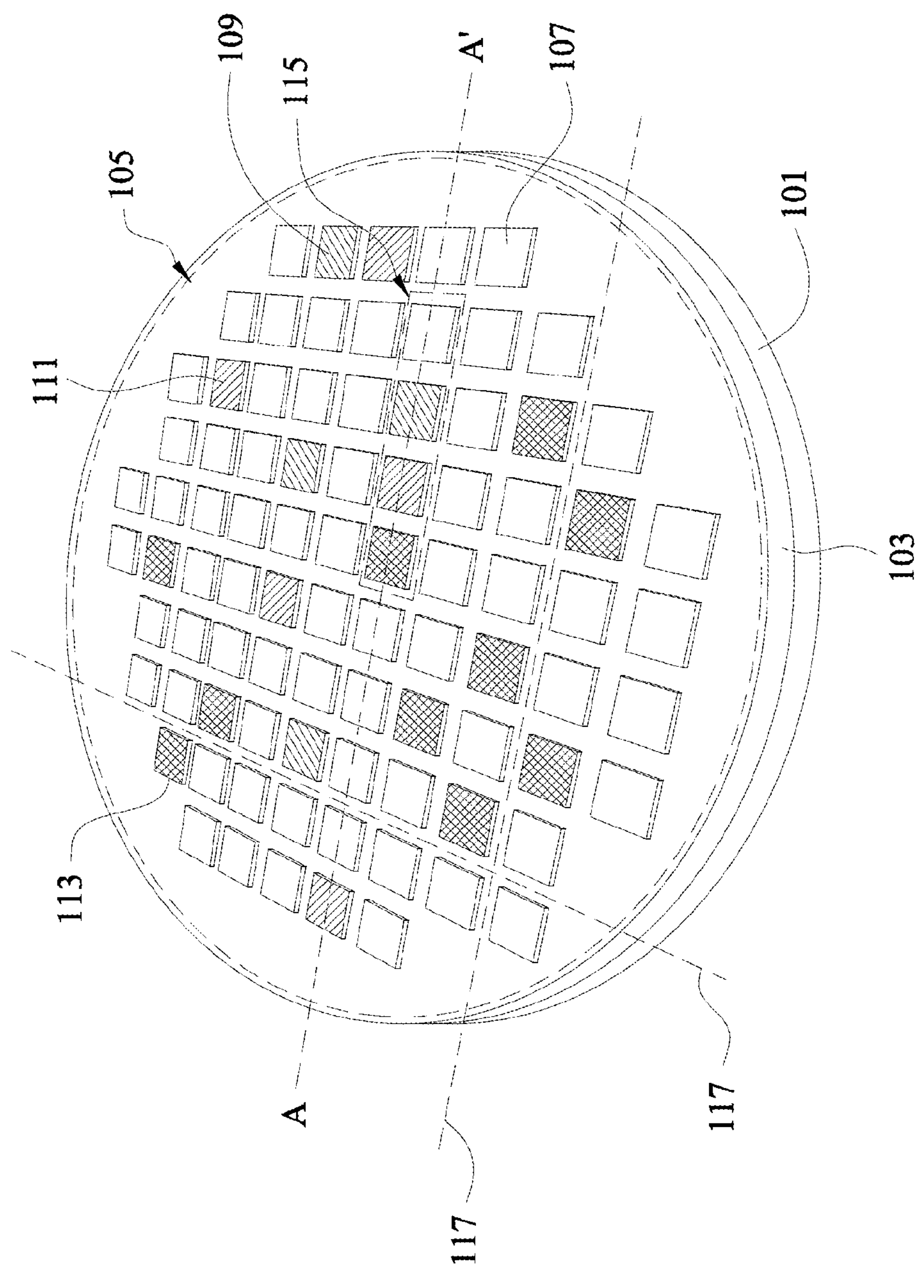
FIG. 1B is a three-dimensional view illustrating integrated circuit packages formed on a substrate on wafer (SoW) in accordance with some embodiments.

Referring further to FIG. 1A, a substrate on panel (SoP) embodiment is illustrated, wherein both the carrier 101 and the substrate 103 have a rectangular shape. In other embodiments, the carrier 101 and the substrate 103 may have various shapes. For example, FIG. 1B illustrates a substrate on wafer (SoW) embodiment, wherein both the substrate 103 and the carrier 101 have a circular form. Shapes of the carrier 101 shown in FIGS. 1A and 1B are for illustrative purpose only, and, in some embodiments, a shape of the carrier 101 may not be the same as a shape of the substrate 103.

Referring further to FIGS. 1A and 1B, as described below in greater detail, the packages 105 are formed on the substrate 103 by stacking multiple tiers of stacking substrates on the substrate 103. After each tier of stacking substrates is mounted on the substrate 103, an E-test is performed to identify good stacks. In some embodiments, subsequent stacking is performed atop only good stacks and, therefore, number of stacking substrates in each of the packages 105 may vary. In what follows, in the illustrated embodiments, three tiers of stacking substrates are attached on the substrate 103. In other embodiments, number of the tiers may vary according to specifications for the packages 105.

The packages 105 may be distinguished according to results of intermediate and final E-tests that are performed on each of the packages 105 during packaging as discussed in greater detail below. In particular, known good packages (KGPs) 107 (indicated by a white fill) are a subset of the packages 105 that passed all E-tests, a first plurality of known bad packages (KBPs) 109 (indicated by a "/" fill), a second plurality of KBPs 111 (indicated by a "\" fill), and a third plurality of KBPs 113 (indicated by a "X" fill) are subsets of the packages 105 that failed one of the E-tests.

As discussed in greater detail below, the second plurality of KBPs 111 and the third plurality of KBPs 113 are packages that failed one of the intermediate E-tests. Moreover, the second plurality of KBPs 111 and the third plurality of KBPs 113 are incomplete packages in the sense that they comprise less number of stacking substrates than the KGPs 107. The first plurality of KBPs 109 are packages that failed the final E-test, and therefore comprise same number of stacking substrates as the KGPs 107. As discussed in greater detail below, each of the KGPs 107 comprises a first number of stacking substrates, each of the first plurality of KBPs 109 comprises a second number of stacking substrates, each of the second plurality of KBPs 111 comprises a third number of stacking substrates, and each of the third plurality of KBPs 113 comprises a fourth number of stacking substrates. In some embodiments, the first number is equal to the second number, the second number is larger than the third number, and the third number is larger than the fourth number. Subsequently, in some embodiments, identified KBPs are re-worked, replaced, removed, discarded, flagged, or otherwise accounted for. The packages 105 are singulated, for example, by sawing along scribe lines 117 between neighboring ones of the packages 105.

In what follows, methods of forming the packages 105 are described with reference to neighboring packages 115, which comprises four packages, one from the KGPs 107, one from the first plurality of KBPs 109, one from the second plurality of KBPs 111, and one from the third plurality of KBPs 113. It should be noted that this configuration of packages is provided to aid in subsequent descriptions of various illustrative embodiments and is not limiting the present disclosure in any manner.

Figure 2:
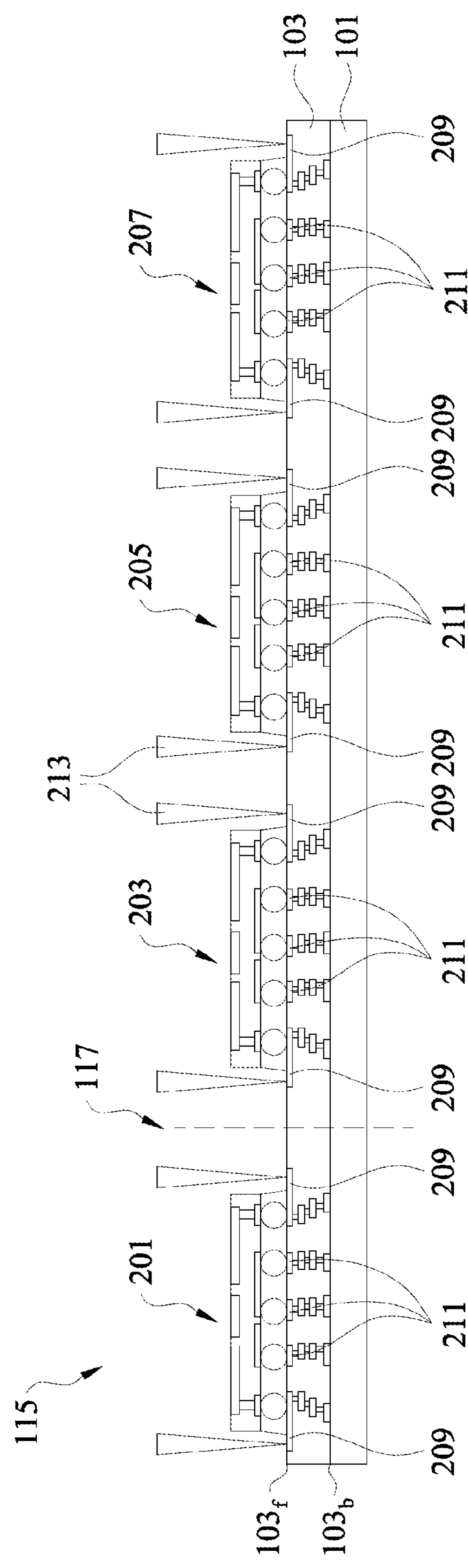
FIGS. 2-6 are cross-sectional views illustrating a method for forming integrated circuit packages in accordance with some embodiments.

Referring to FIGS. 2-6, there are shown cross-sectional views (along a line AA' in FIGS. 1A and 1B) of the neighboring packages 115 illustrating a method of forming the packages 105 in accordance with some embodiments. In the illustrated embodiment, stacking substrates are integrated circuit dies. Turning first to FIG. 2, a first tier of dies comprising a first die 201, a second die 203, a third die 205 and fourth die 207 are mounted to the substrate 103. The first die 201, the second die 203, the third die 205, the fourth die 207 may be mounted to the substrate 103 via, for example, ball bonding, solder mounting, copper balls, copper pillars, and the like, which provide electrical connections between the first tier dies and the substrate 103. In some embodiments, each of the first tier of dies, and all the other dies described below comprise one or more system-on-chips (SoCs), memory chips, memory cubes, processor chips, logic chips, and combinations thereof.

Moreover, probing pads 209 associated with each die are shown on a front side $\mathbf{103}_f$ of the substrate 103 in addition to first plurality of contact pads 211 that are typically formed on the front side $\mathbf{103}_f$ of the substrate 103 for provide electrical connections to the first tier of dies. In the illustrated embodiment, two probing pads for each die are formed on the front side $\mathbf{103}_f$ of the substrate 103. In other embodiments, there could be one or more probing pads that is/are common to one or more of the mounted dies, and/or there could be a different number of probing pads associated with each die. In the illustrated embodiment, the probing pads 209 are formed in locations of the substrate 103, such as scribe lines 117, where the substrate 103 will be subsequently singulated.

Referring further to FIG. 2, after the first tier of dies are mounted to the substrate 103 as described above, electrical and/or functional testing is performed to ensure proper functioning of the first die 201, the second die 203, the third die 205, and the fourth die 207, as well as proper electrical connection between the first tier of dies and the substrate 103, and/or proper functioning of intermediate packages as a whole. In some embodiments, a first E-test 213 is performed after the first tier of dies is mounted to the substrate 103 resulting in, for example, a "fail" indication for the first die 201, and a "pass" indication for the second die 203, the third die 205, and the fourth die 207. Based on the results of the first E-test 213, the first die 201 is identified as a known bad die (KBD), while the second die 203, the third die 205, and the fourth die are identified as known good dies (KGDs).

Figure 3:
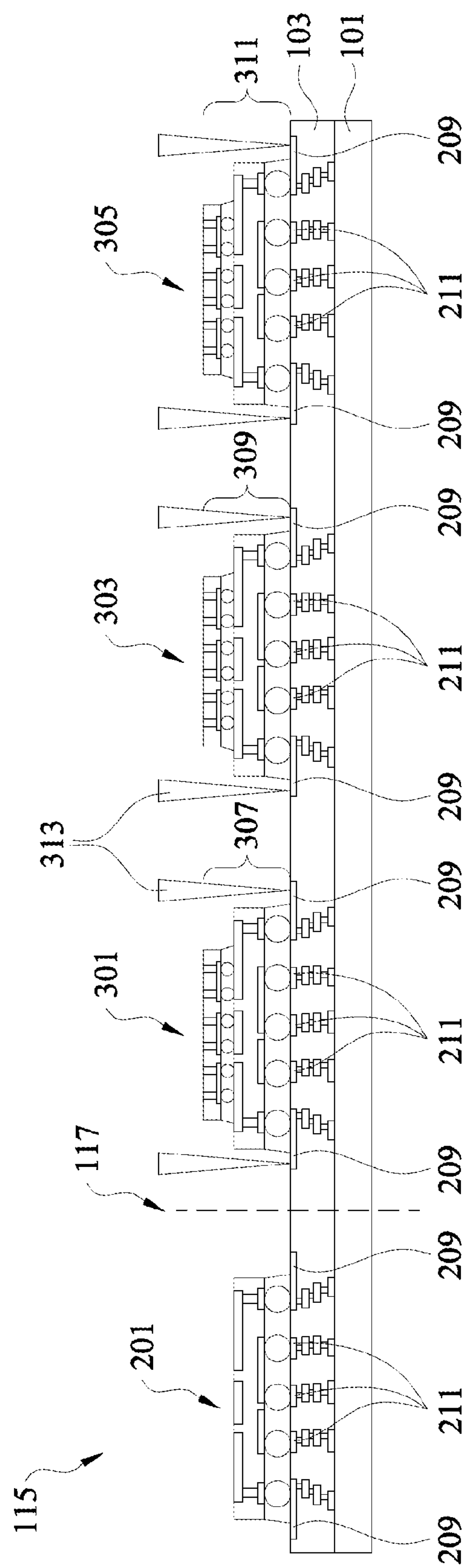

Referring to FIG. 3, subsequently a second tier of dies is mounted atop some of the first tier of dies. Because the first die 201 of the first tier of dies is identified as a KBD, a second tier die is not mounted atop the first die 201. By identifying the first die 201 as a KBD at an intermediate stage, manufacturing costs can be substantially reduced by not mounting additional dies atop the first die 201. In addition, no subsequent E-test is performed on the first die 201. In the illustrated embodiment, the second tier of dies comprises a fifth die 301 mounted atop of the second die 203, a sixth die 303 mounted atop the third die 205, and a seventh die 305 mounted atop the fourth die 207. The second tier dies may be mounted to the first tier dies using, for example, micro bumps, copper pillars, and the like, which provide electrical connections between the second tier dies and KGDs of the first tier dies.

Referring further to FIG. 3, after the second tier of dies are mounted atop the KGDs of the first tier of dies, a second E-test 313 is performed to test obtained intermediate packages. The second E-test 313 is performed to ensure proper functioning of the second tier of dies, proper electrical connection between the second tier of dies and the first tier of dies, and/or proper functioning of the intermediate packages as a whole. In the illustrated embodiment, only three die stacks need to be tested, since the first die 201 has already been flagged as a KBD. For example, the second E-test 313 results in a “fail” indication for a first die stack 307 comprising the second die 203 and the fifth die 301, and a “pass” indication for a second die stack 309 comprising the third die 205 and the sixth die 303, and a third die stack 311 comprising the fourth die 207 and the seventh die 305. Accordingly, the first die stack 307 is identified as a bad stack, and the second die stack 309 and the third die stack 311 are identified as good stacks, because they passed both rounds of E-testing, such as the first E-test 213 and the second E-test 313.

Figure 4:
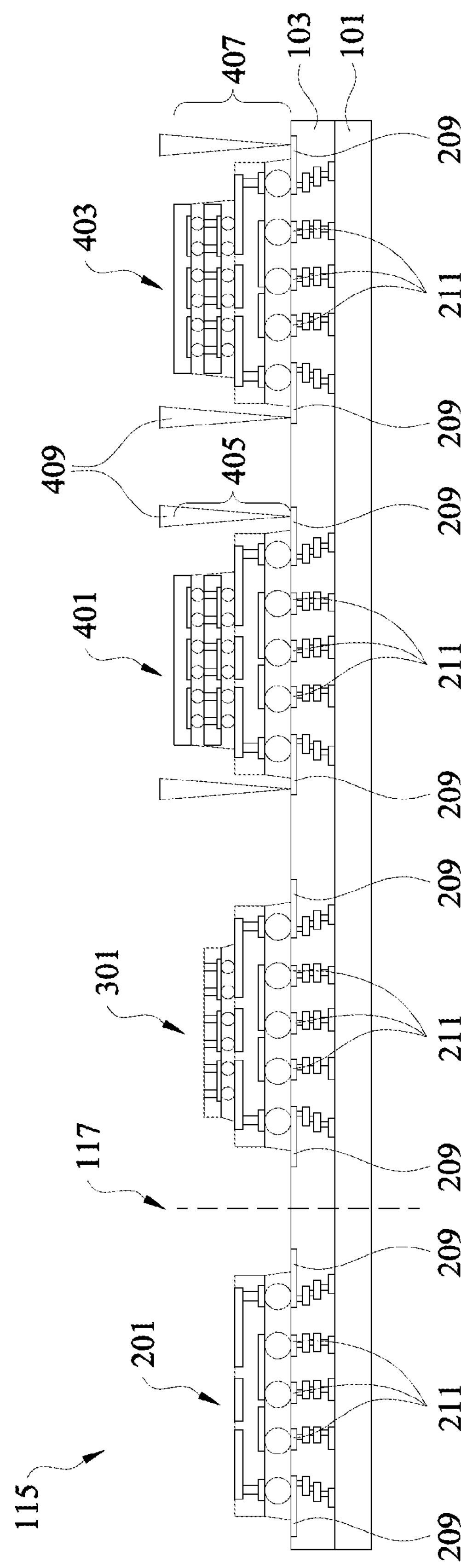

Referring to FIG. 4, a third tier of dies is mounted atop some of the second tier of dies. In the illustrated embodiment, the third tier of dies comprises an eighth die 401 mounted atop the sixth die 303 and a ninth die 403 mounted atop the seventh die 305, which completes formation of the packages 105. Subsequently, the final E-test 409 is performed on a fourth die stack 405 comprising the third die 205, the sixth die 303, and the eighth die 401, and a fifth die stack 407 comprising the fourth die 207, the seventh die 305, and the ninth die 403 to ensure proper functioning of the fourth die stack 405 and the fifth die stack 407. In the illustrated embodiment, the final E-test 409 results in a “fail” indication for the fourth die stack 405 and a “pass” indication for the fifth die stack 407. Accordingly, the fourth die stack 405 is identified as a bad stack, and the fifth die stack 407 is identified as a good stack.

To summarize, referring again to FIGS. 1A and 1B, the first die 201 represents one of the third plurality of KBPs 113, the first die stack 307 represents one of the second plurality of KBPs 111, the fourth die stack 405 represents one of the first plurality of KBPs 109, and the fifth die stack 407 represents one of the KGPs 107. As described in greater detail above, in some embodiments, each of the packages 105 comprises at most three stacking substrates mounted atop one another. However, in other embodiments, the packages 105 may comprise any number of stacking substrates according to design specifications for the packages 105.

Figure 5:
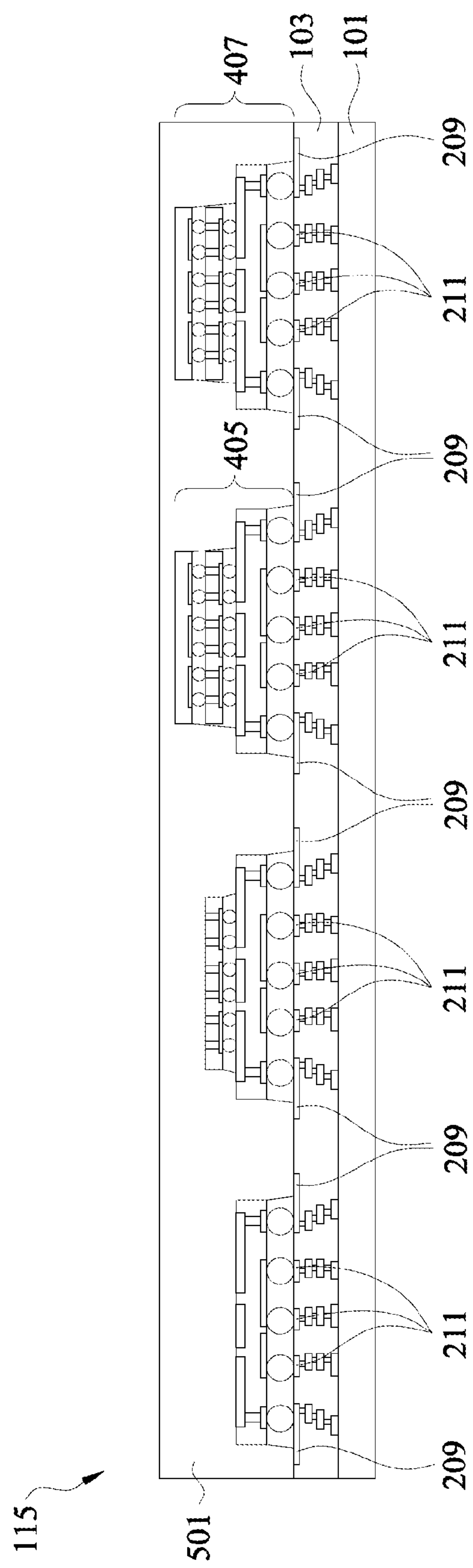

In some embodiments, a molding compound 501 is disposed around the packages 105 over the substrate 103, as shown in FIG. 5. The molding compound 501 fills spaces between the packages 105 and encapsulates the packages 105 from, for example, external contaminants and moisture. The molding compound 501 comprises a molding material and may comprise epoxy, an organic polymer, or a polymer with or without a silica-based or glass based filler added, and the like. In some embodiments, the molding compound 501 comprises a liquid molding compound (LMC) that is a gel type liquid when applied. Alternatively, the molding compound 501 may comprise other insulating materials. Excess material of the molding compound 501 may be removed from over the packages 105 using, for example, a chemical-mechanical polish (CMP), etch process, or the like.

Figure 6:
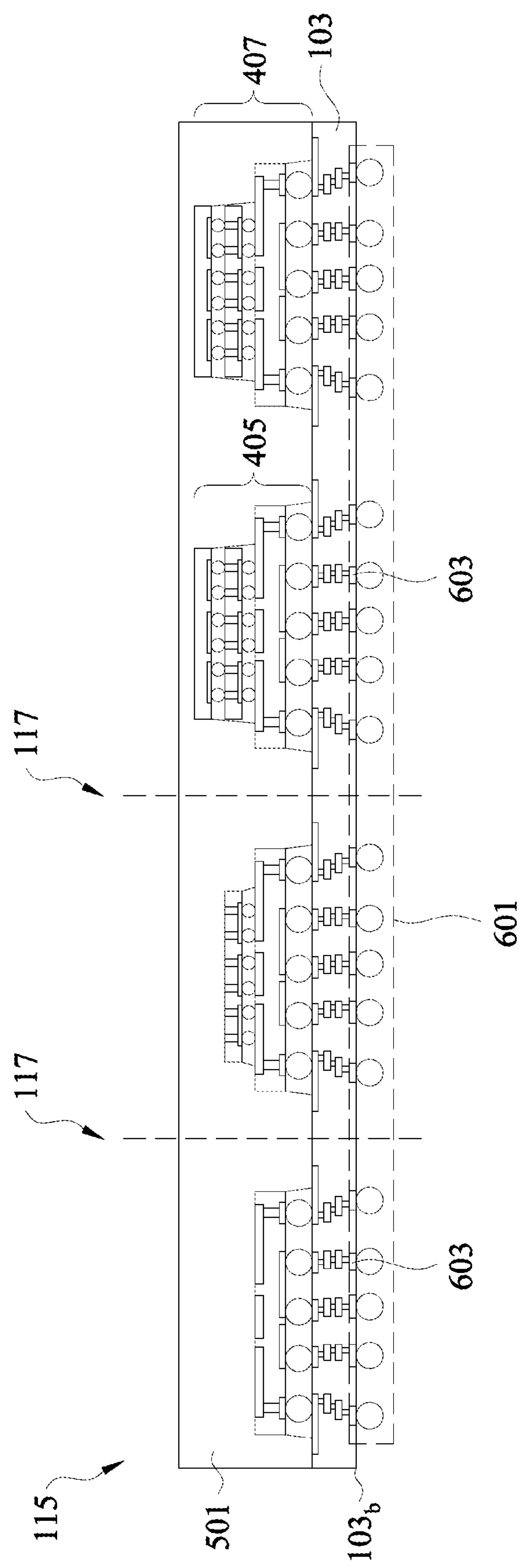

Referring to FIG. 6, the carrier 101 is debonded from the substrate 103 and connectors 601 are mounted to second plurality of contact pads 603 on a back side 103*b* of the substrate 103. In some embodiments, the connectors 601 may comprise solder bumps, solder balls, copper bumps, copper pillars, a ball grid array (BGA), and the like. Subsequently, the packages 105 are singulated, for example, by sawing the substrate 103 along the scribe lines 117. Alternatively, one or more of the KBPs could be re-worked if commercially viable, or could be singulated and sold as a non-fully-stacked package. In some embodiments, the probing pads 209 are not destroyed by the singulation process and remain on the packages 105.

Figure 7A:
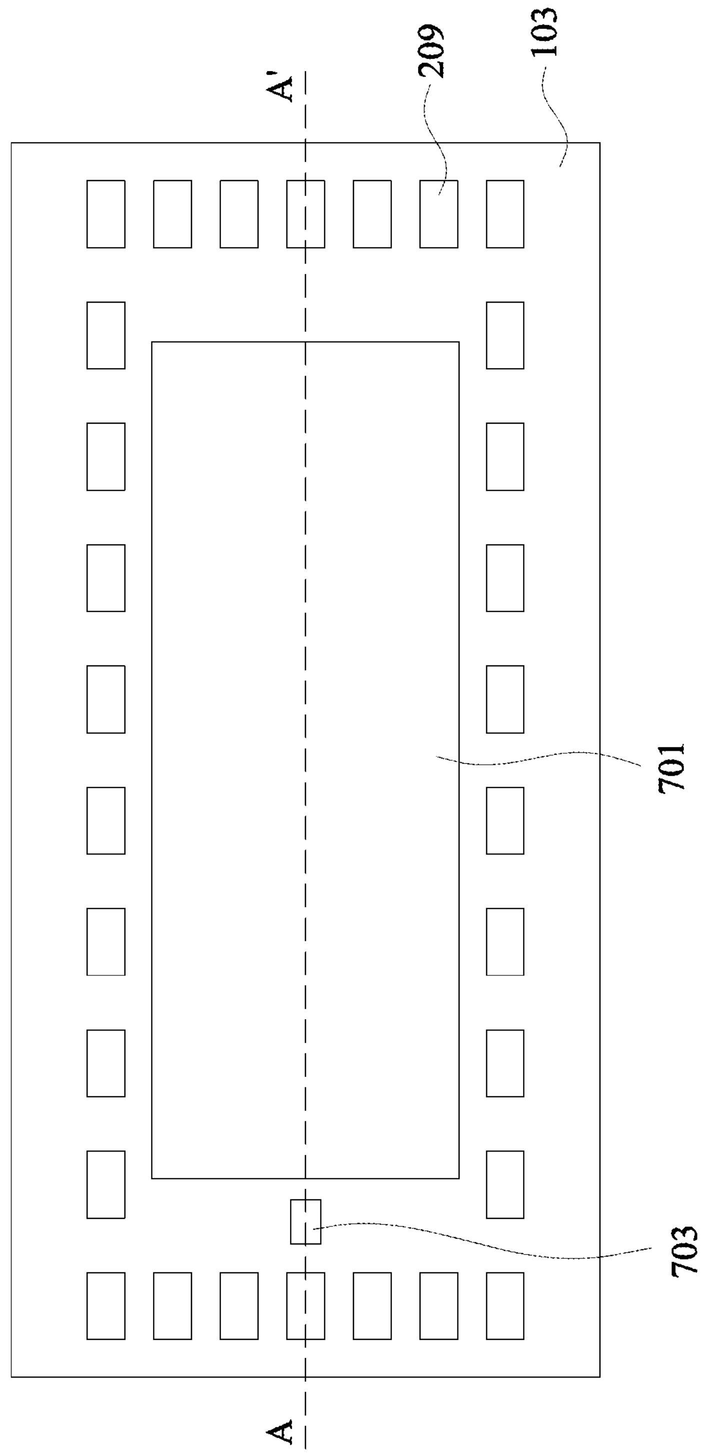
FIGS. 7A-11B are cross-sectional views illustrating an E-testing process on a package during an intermediate packaging process in accordance with some embodiments.
Figure 7B:
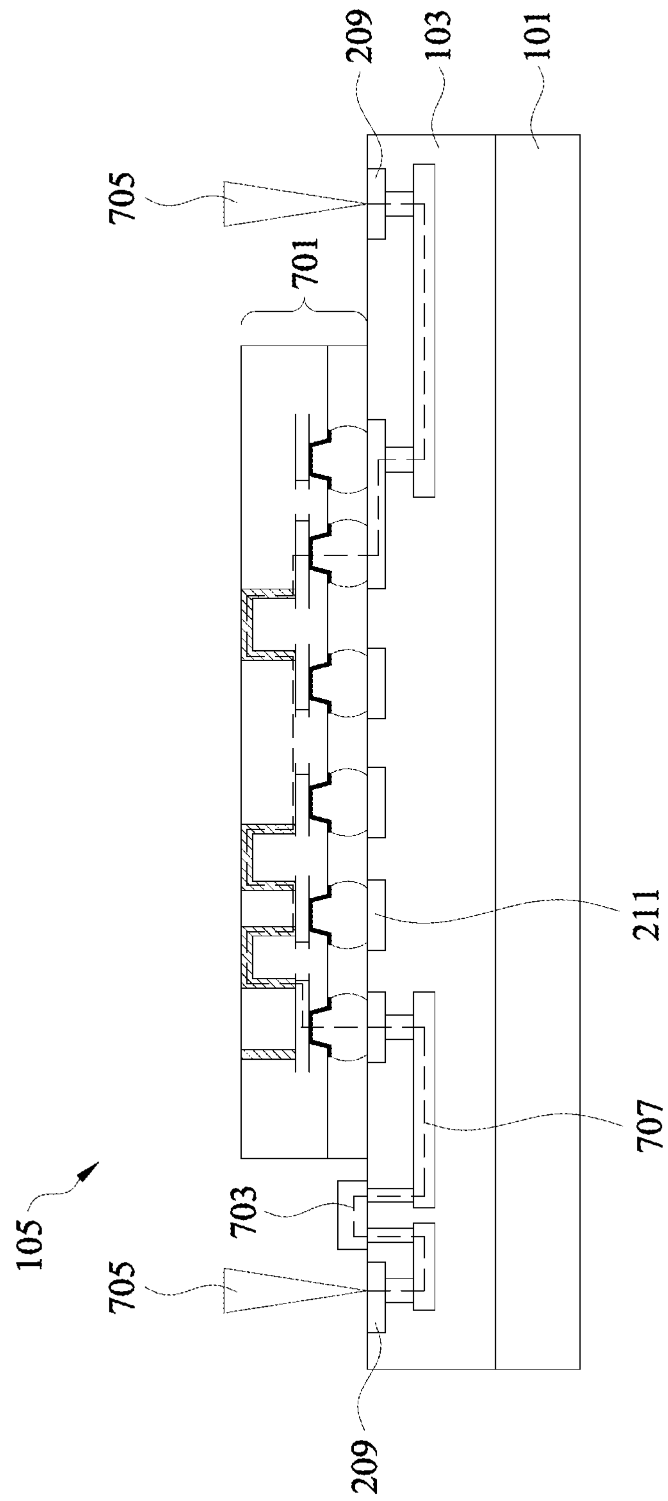

FIGS. 7A-11B illustrate an E-testing process on one of the packages 105 during intermediate packaging steps as described above with reference to FIGS. 2 and 3. Turning first to FIGS. 7A and 7B, there are shown a top and cross sectional views (along the line AA' in FIG. 7A), respectively, of one of the packages 105 during an intermediate packaging step described above with reference to FIG. 2. In particular, FIGS. 7A and 7B show a first tier die 701 mounted on the substrate 103 on the carrier 101. The probing pads 209, as illustrated in FIG. 7A, have rectangular shapes. However, in other embodiments, the probing pads 209 may have other shapes, such as a square shape, a circular shape, and the like. In addition, in some embodiments, surface mounted devices (SMDs) 703 may be formed on the substrate 103, which may play a role of process control monitor (PCM) structures. For example, the SMDs 703 may comprise passive devices such as, for example, resistors, capacitors, or the like, or active devices such as, for example, diodes, or the like. An intermediate E-test 705 is performed on an intermediate package through the probing pads 209. In some embodiments, the intermediate E-test 705 that is preformed on the intermediate package may comprise, for example, a PCM test on the first tier die 701, a known good stack (KGS) test, and a full function circuit probe (CP) test. A possible current flow path 707 through the intermediate package during the intermediate E-test 705 is illustrated in FIG. 7B. For example, the current may flow from one probing pad to another probing pad through the SMDs 703, through conductive lines and vias of the substrate 103, through interconnects between the substrate 103 and the first tier die 701, and through the first tier die 701.

Figure 8A:
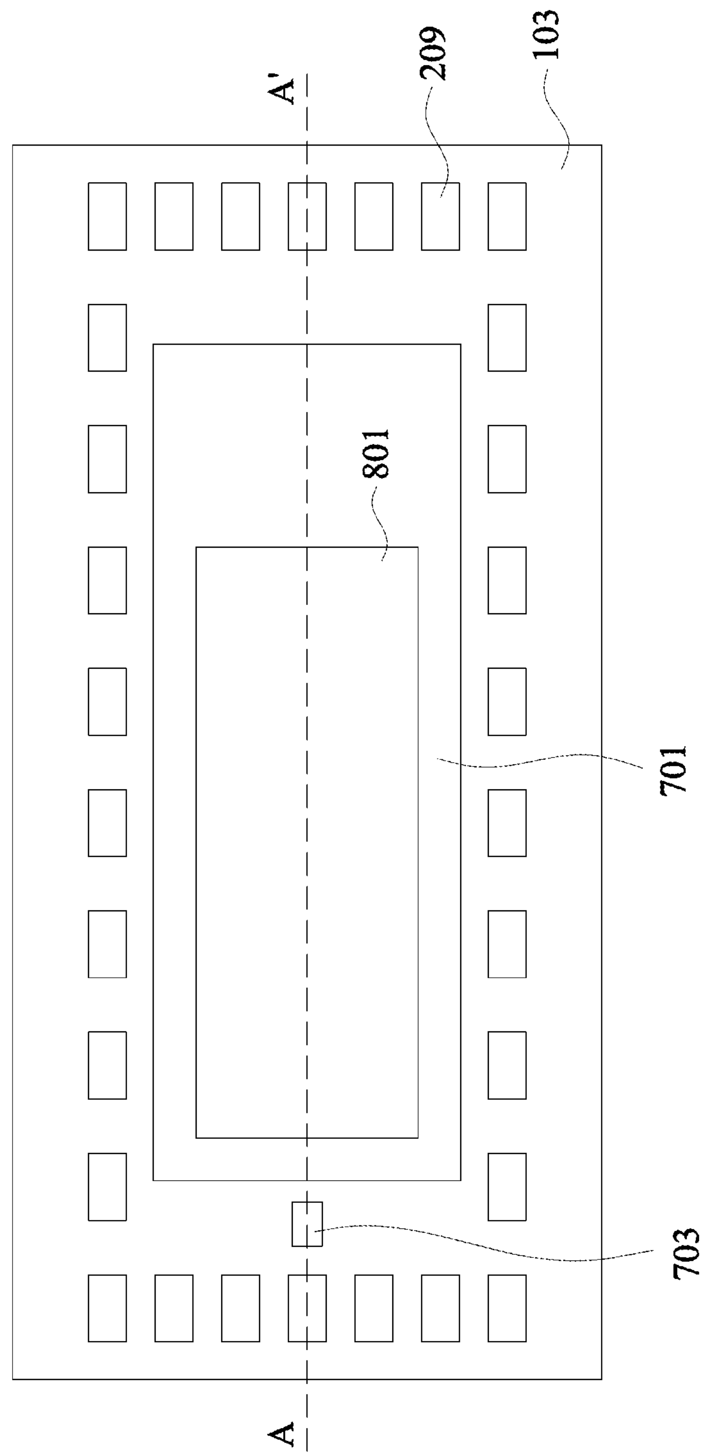
Figure 8B:
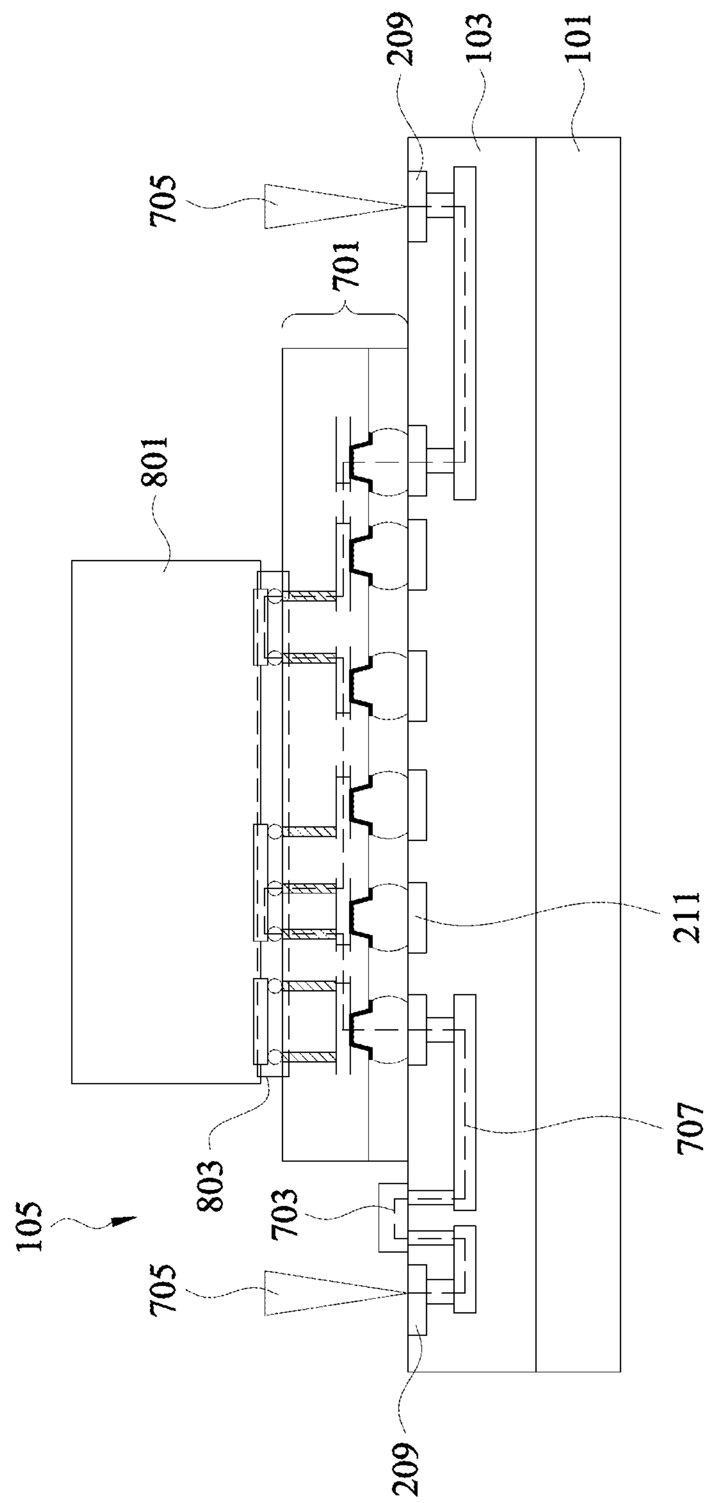

FIGS. 8A and 8B illustrate an E-testing process on one of the packages 105 during intermediate packaging steps as described above with reference to FIG. 3. In particular, FIGS. 8A and 8B show a top and cross sectional views (along the line AA' in FIG. 8A), respectively, of a second tier die 801 mounted the intermediate package of FIGS. 7A and 7B. In the illustrated embodiment, the second tier die 801 is mounted on the first tier die 701 using, for example, micro bumps 803. The intermediate E-test 705 is performed on a resulting intermediate package through the probing pads 209. In some embodiments, the intermediate E-test 705 may comprise, for example, a PCM test on the second tier die 801, a known good stack (KGS) test, a continuity test between the first tier die 701 and the second tier die 801, and a full function circuit probe (CP) test. A possible current flow path 707 through the resulting intermediate package during the intermediate E-test 705 is illustrated in FIG. 8B. For example, the current may flow from one probing pad to another probing pad through the SMDs 703, through conductive lines and vias of the substrate 103, through interconnects between the substrate 103 and the first tier die 701, though the micro bumps 803 and through the second tier die 801.

Figure 9A:
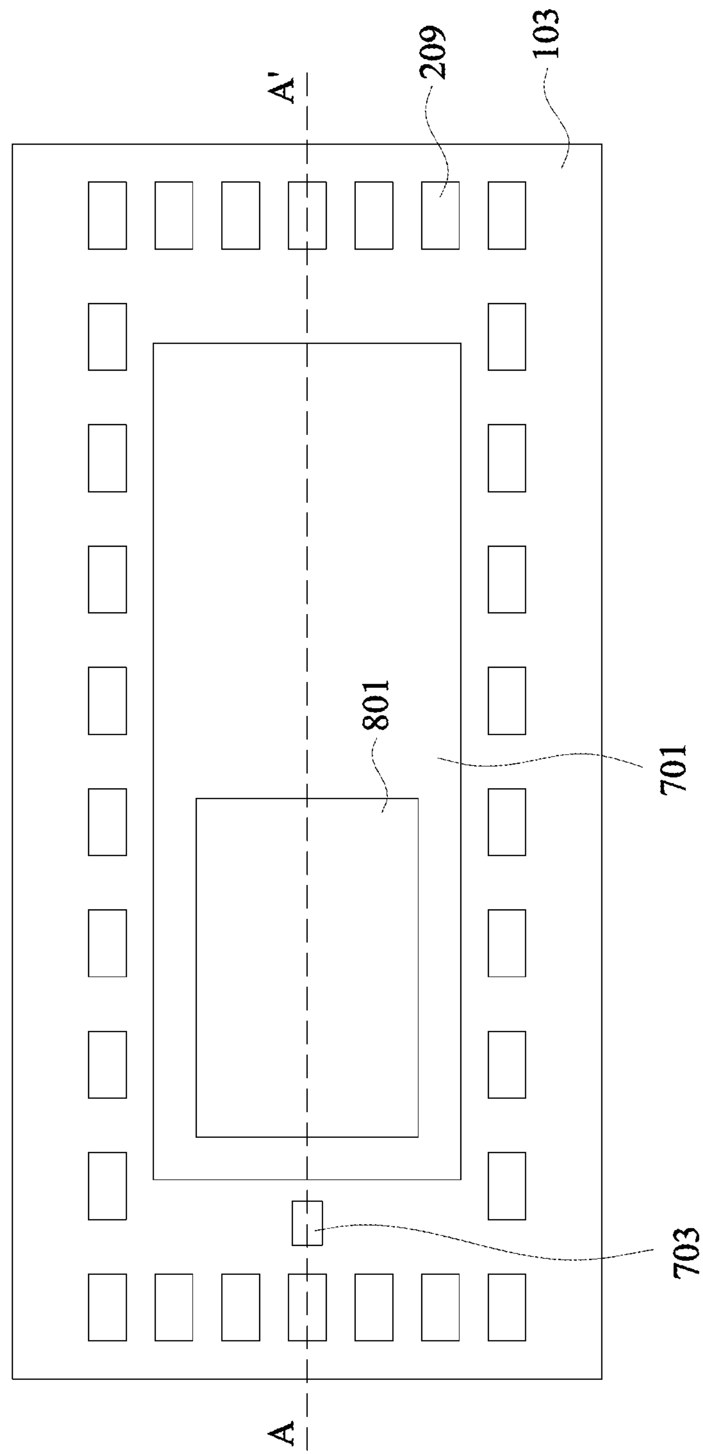
Figure 9B:
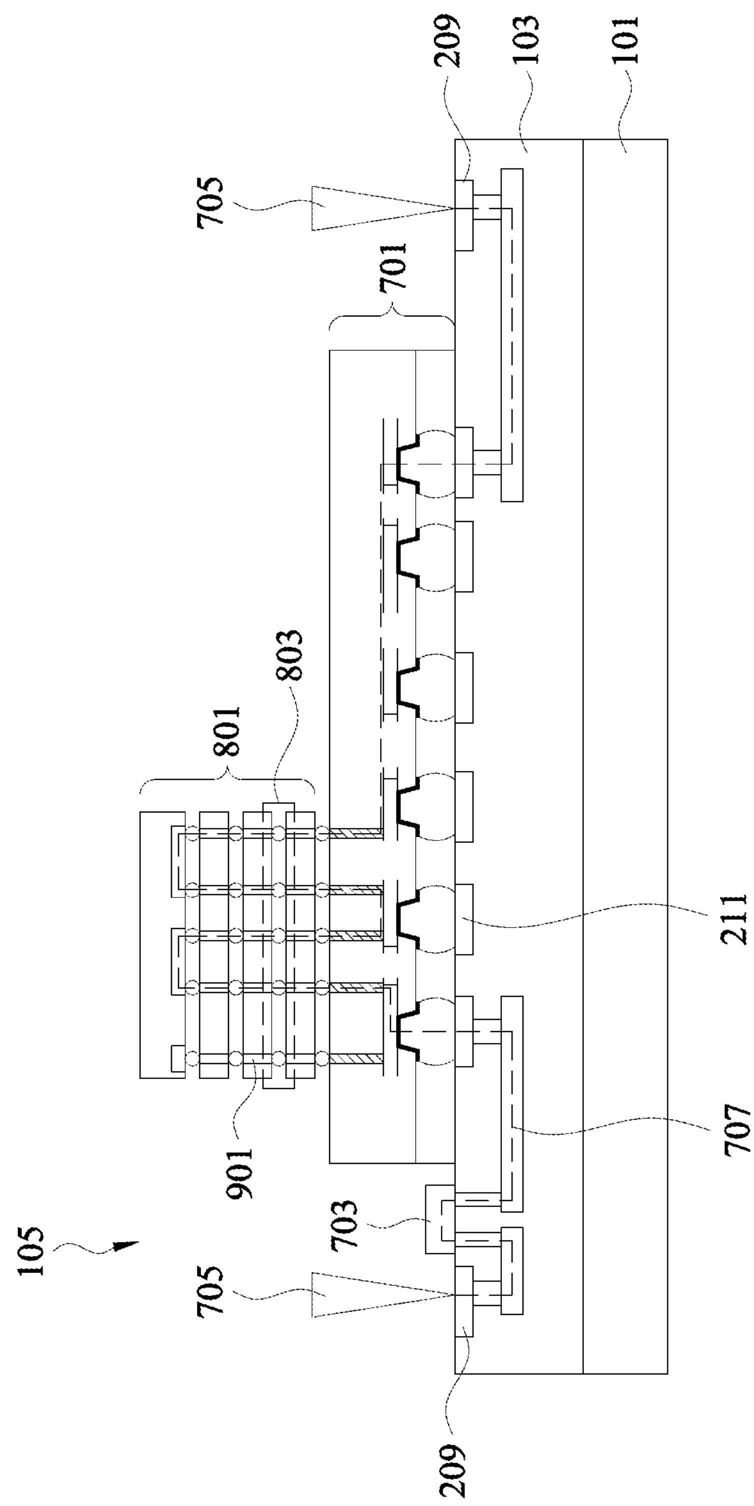
Figure 10A:
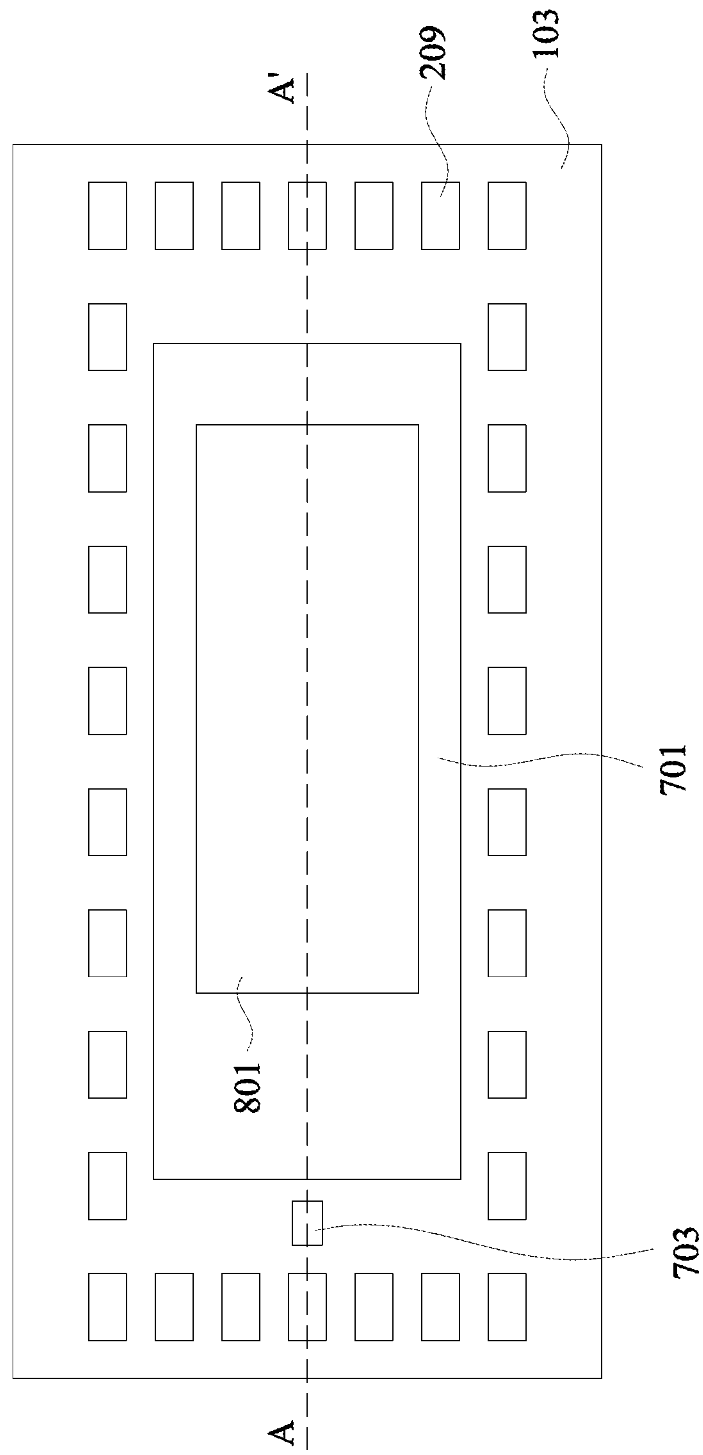
Figure 10B:
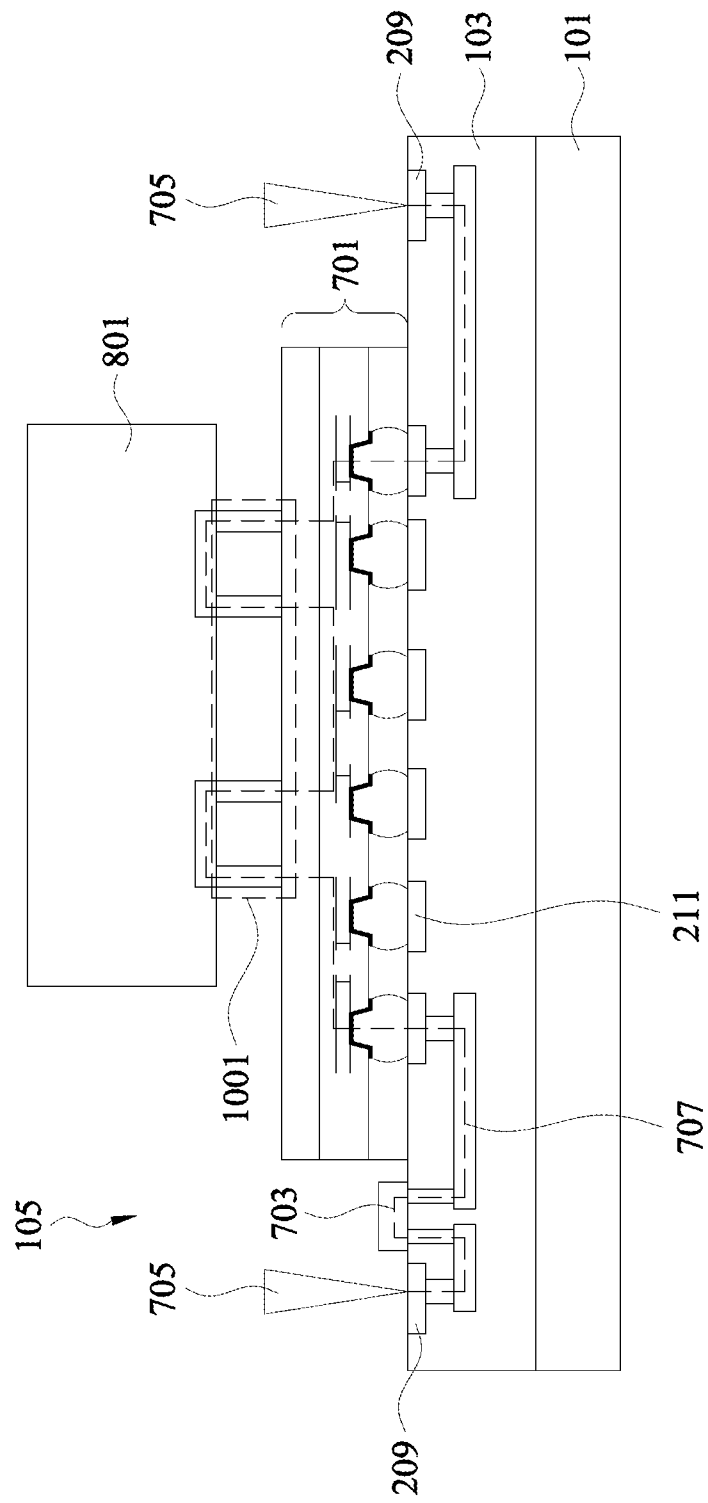
Figure 11A:
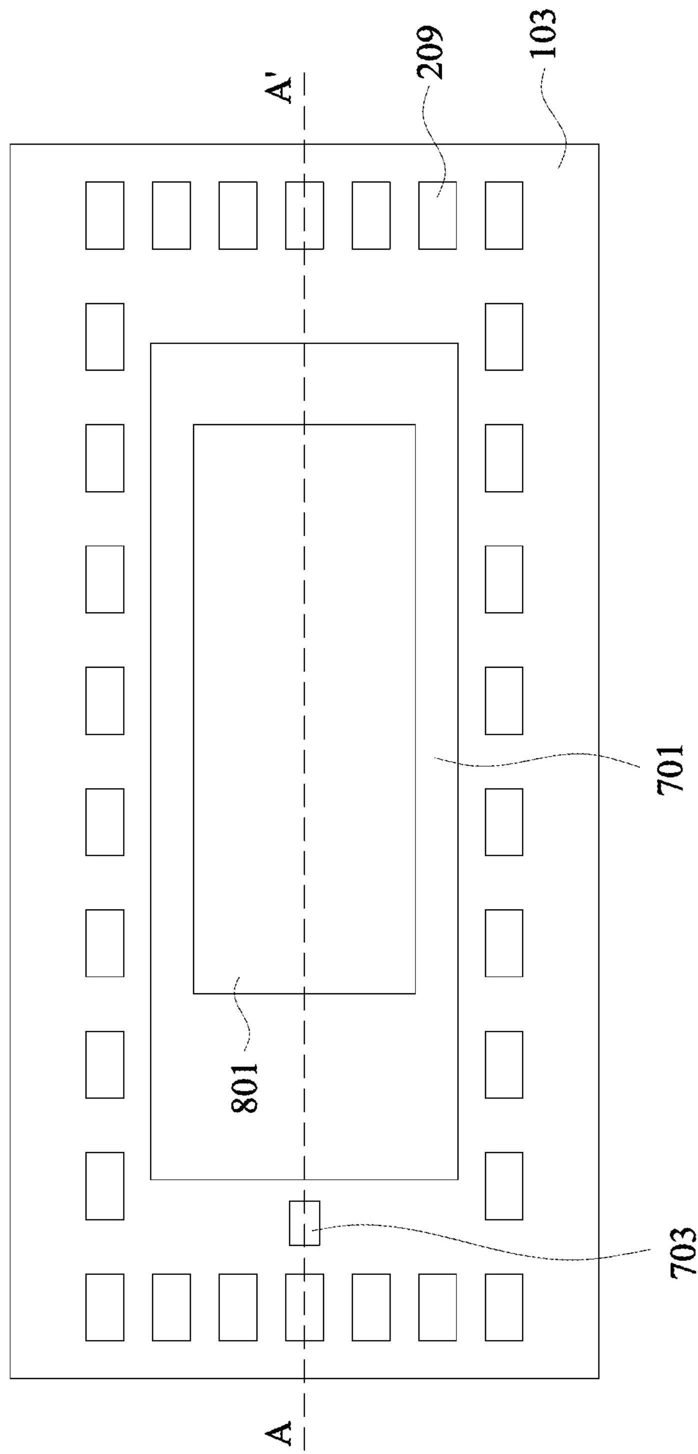
Figure 11B:
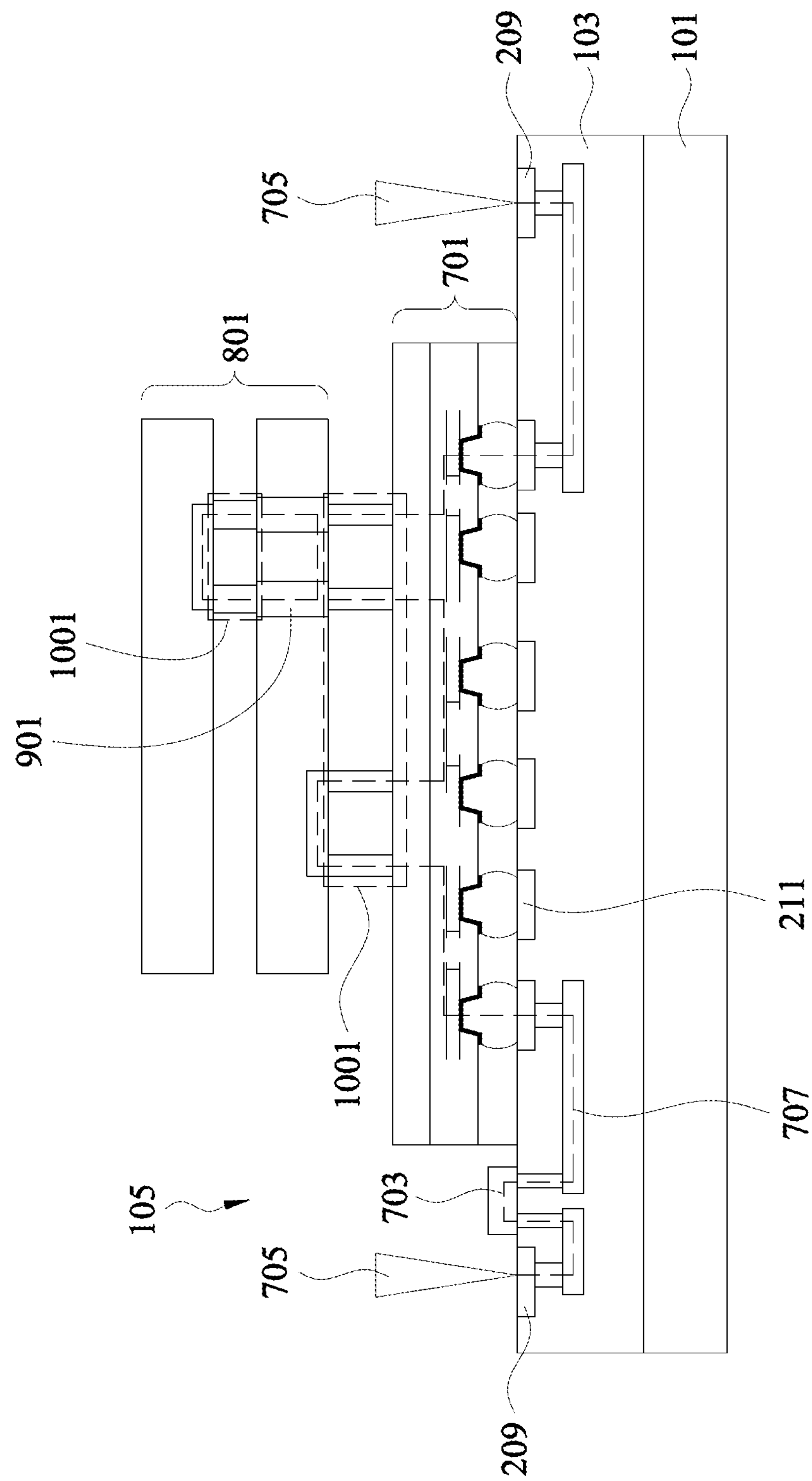

FIGS. 9A and 9B illustrate an E-testing process on one of the packages 105 during intermediate packaging steps as described above with reference to FIG. 3. In particular, FIGS. 9A and 9B are a top and cross sectional views (along the line AA' in FIG. 9A), respectively, illustrating an embodiment similar to one described above with reference to FIGS. 8A and 8B. In the illustrated embodiment, the second tier die 801 is represented as a die stack, wherein individual dies are stacked and interconnected with one another using, for example, the micro bumps 803 and through silicon or through substrate vias (TSVs) 901. In some embodiments, during the intermediate E-test 705 the current may flow from one probing pad to another probing pad through the SMDs 703, through conductive lines and vias of the substrate 103, through interconnects between the substrate 103 and the first tier die 701, though the micro bumps 803 and through the TSVs 901 of the second tier die 801.

FIGS. 10A-11B illustrate an E-testing process on one of the packages 105 during intermediate packaging steps as described above with reference to FIGS. 2 and 3. In particular, FIGS. 10A-11B are a top and cross sectional views (along the lines AA' in FIGS. 10A and 11A), respectively, illustrating embodiments similar to ones described above with reference to FIGS. 8A-9B. In the illustrated embodiments, individual dies of the intermediate package are mounted to one another using the conductive pillars 1001. In some embodiments, during the intermediate E-test 705 the current may flow from one probing pad to another probing pad through the SMDs 703, through conductive lines and vias of the substrate 103, through interconnects between the substrate 103 and the first tier die 701, though the conductive pillars 1001, and through the TSVs 901 of the second tier die 801.

Figure 14:
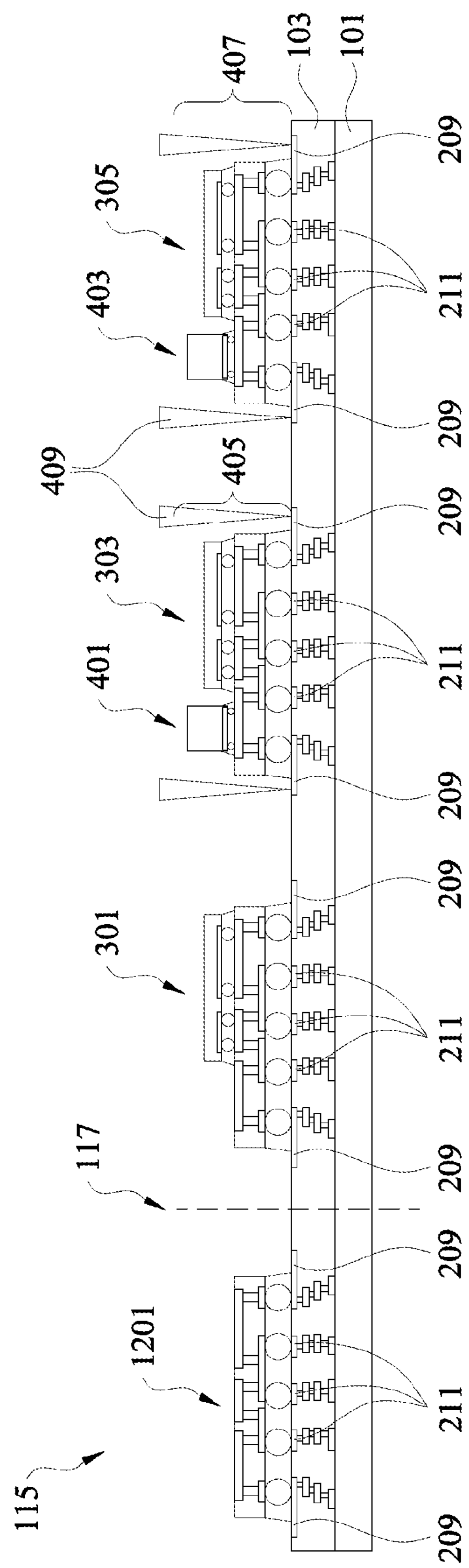
Figure 15:
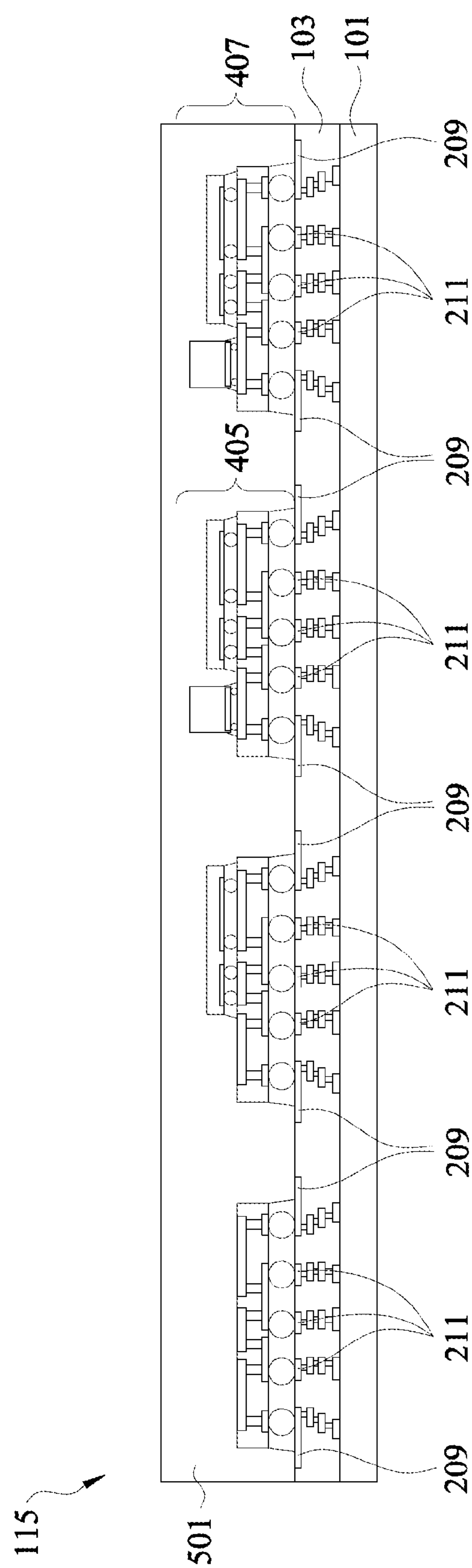
Figure 16:
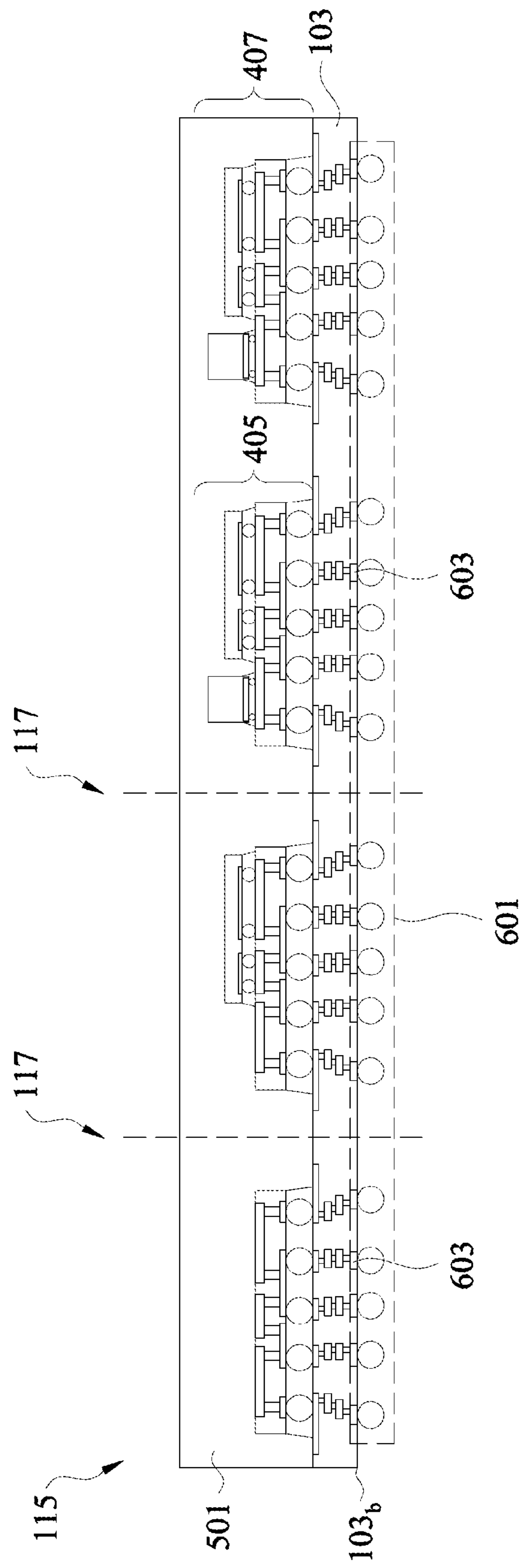
Figure 17:
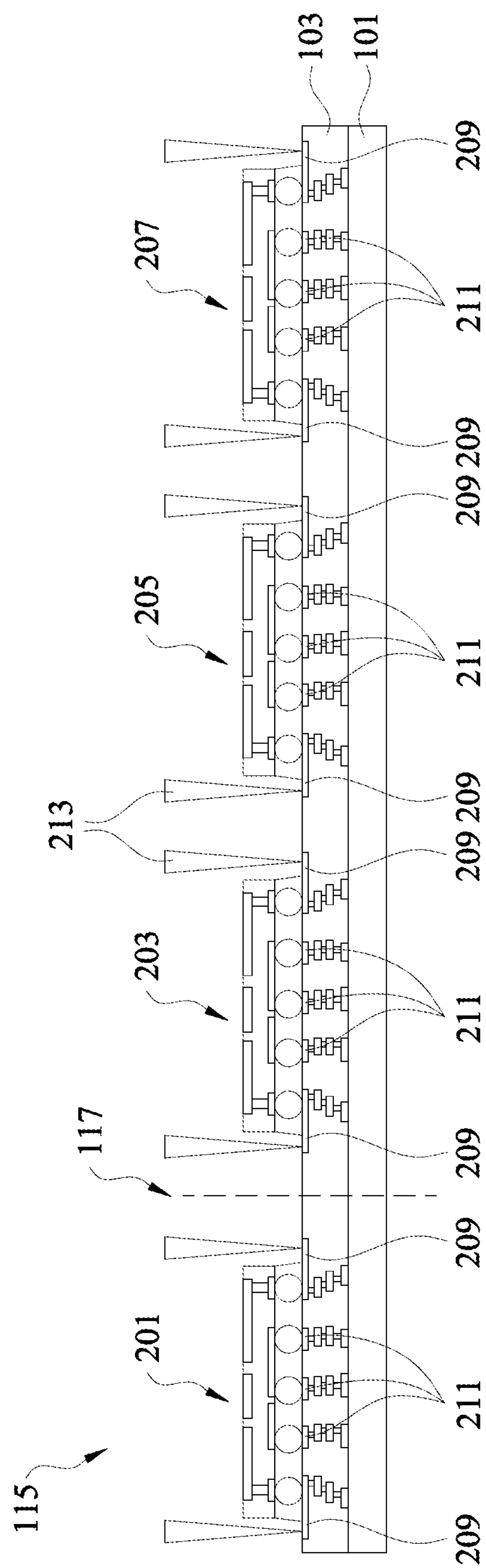
FIGS. 17-21 are cross-sectional views illustrating a method for forming integrated circuit packages in accordance with some embodiments.

Referring to FIGS. 12-16, there are shown a cross-sectional views (along a line AA' in FIGS. 1A and 1B) of the neighboring packages 115 illustrating a method of forming the packages 105 in accordance with some embodiments. In particular, FIGS. 12-16 illustrate an embodiment in which interposer on substrate on wafer (IoSoW) packages are formed. As described below in greater detail, the illustrated packaging method is similar to one described above with reference to FIG. 2-6. However, in the illustrated embodiment, the first tier of stacking substrates may be interposers atop which second tier of dies and third tier of dies are mounted. In some embodiments, a second tier die and a third tier die are mounted side by side atop an interposer to form one of the packages 105 as illustrated in FIGS. 14-16. In the illustrated embodiment, the interposer provides electrical connection between the second tier die and the third tier die.

Figure 12:
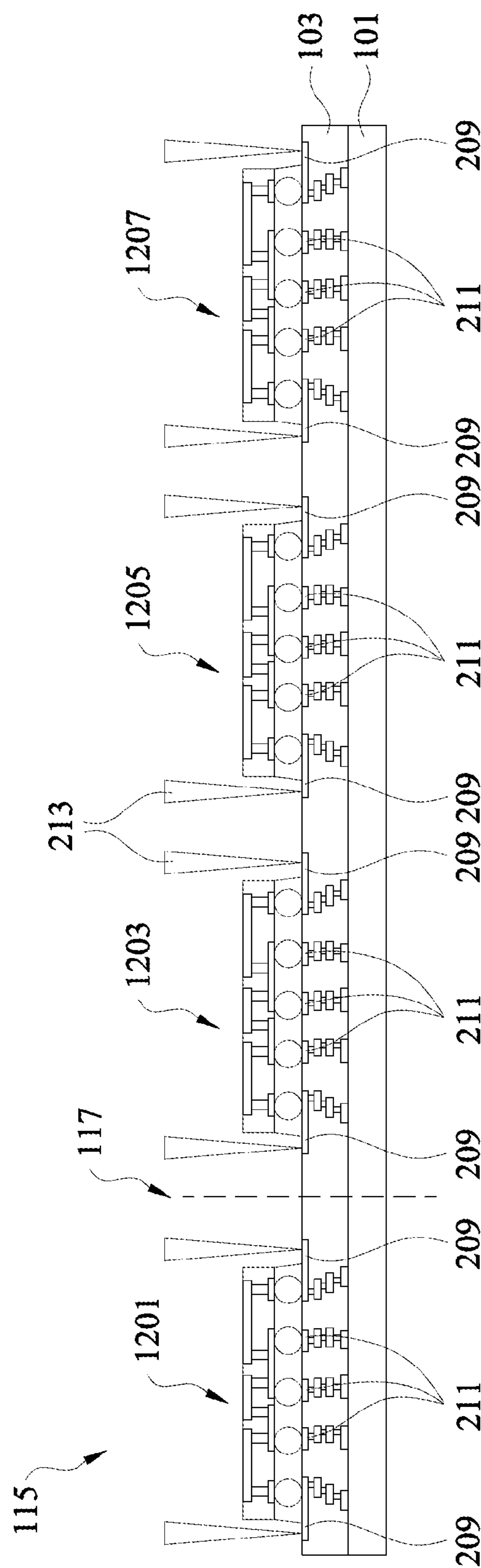
FIGS. 12-16 are cross-sectional views illustrating a method for forming integrated circuit packages on an interposer on substrate on wafer (IoSoW) in accordance with some embodiments.
Figure 13:
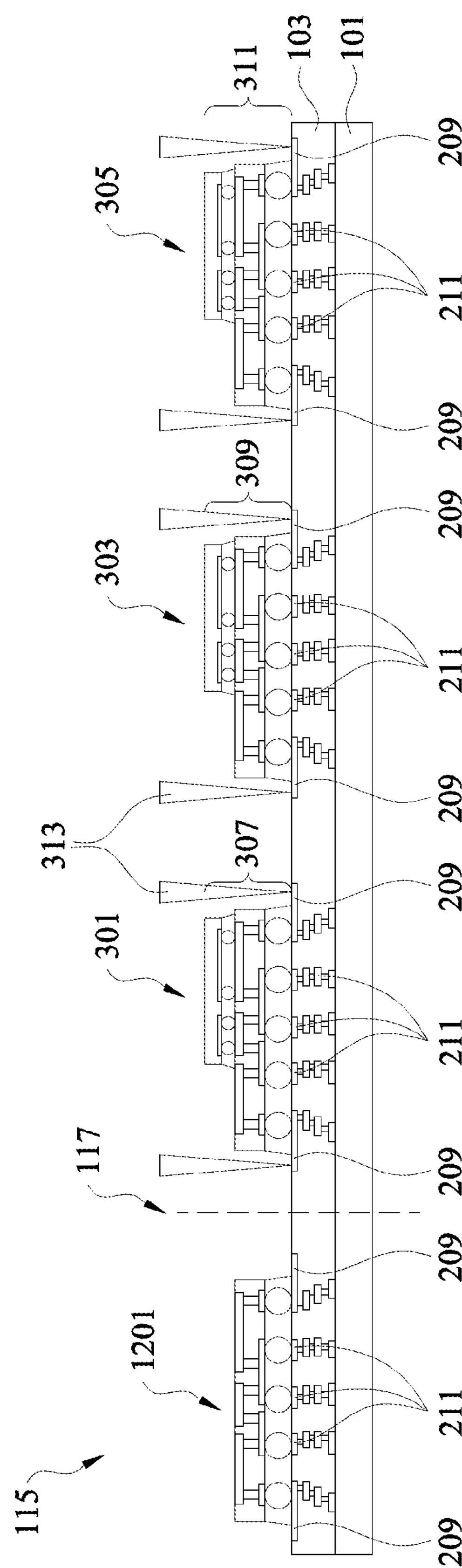

Turning first to FIG. 12, in this embodiment, the first tier of stacking substrates are represented by a first interposer 1201, a second interposer 1203, a third interposer 1205, and a fourth interposer 1207, respectively. Each interposer could be formed of a silicon wafer, glass, or the like, and could have one or more through vias extending therethrough. In some embodiments, one or more of the interposers could have active or passive devices formed thereon.

Referring further to FIGS. 12-16, subsequent packaging steps, similar to those described above with reference to FIGS. 2-6, are preformed to form the packages 105. As described in greater detail above, in some embodiments, each of the packages 105 comprises at most three stacking substrates. However, in other embodiments, the packages 105 may comprise any number of stacking substrates according to design specifications for the packages 105. Furthermore, numerous variations of the above discussed embodiments will be apparent to those skilled in the art once informed by the present disclosure.

Figure 18:
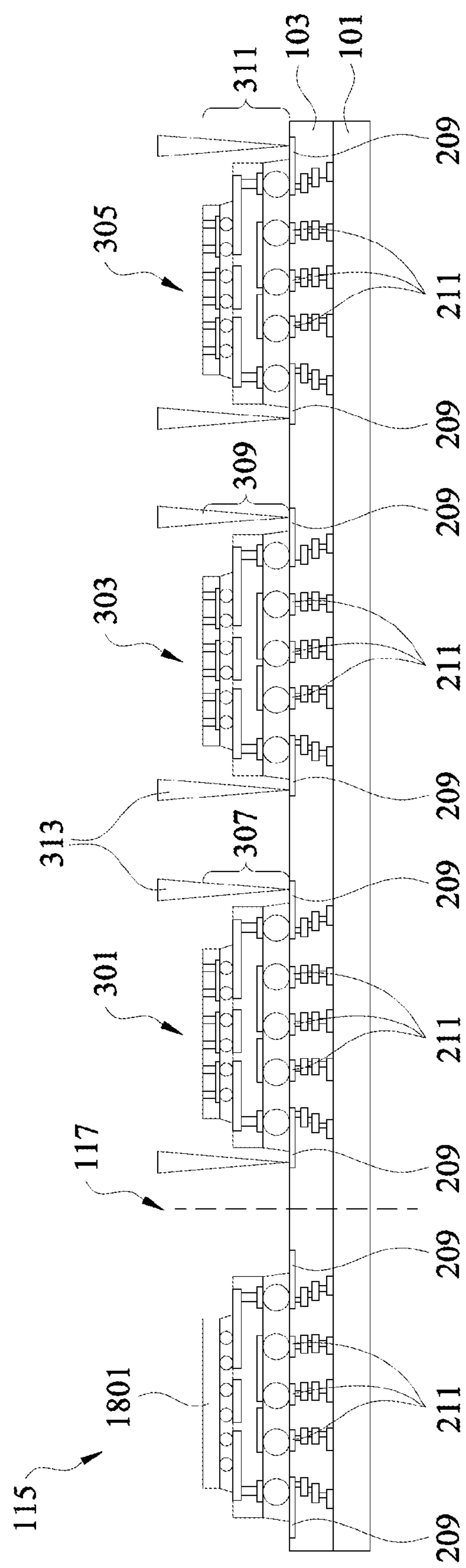
Figure 19:
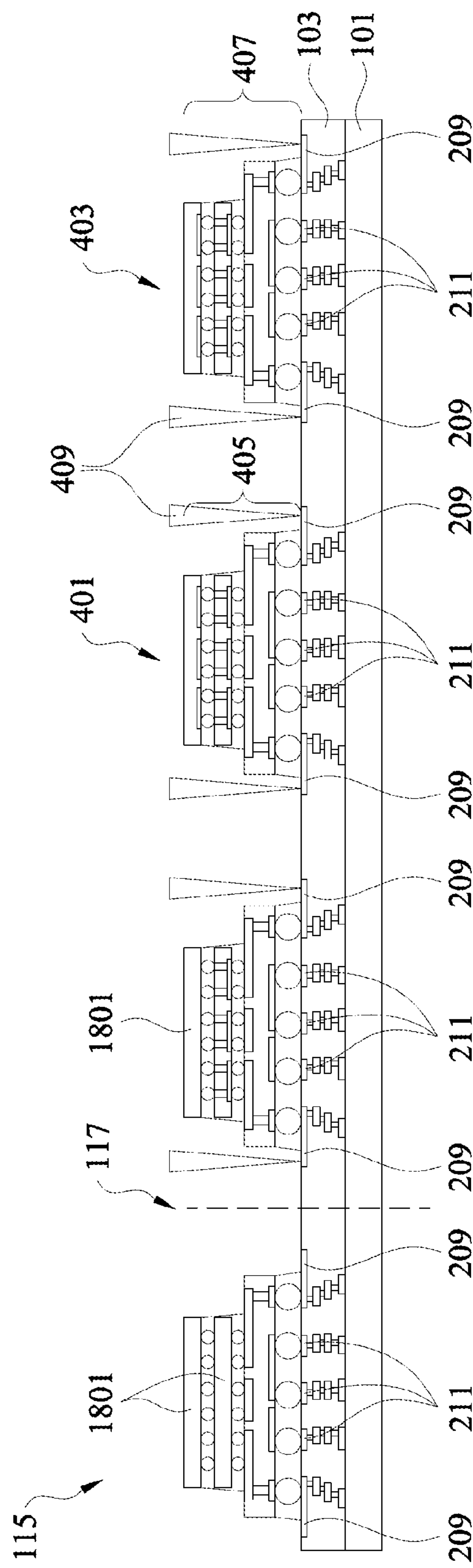
Figure 20:
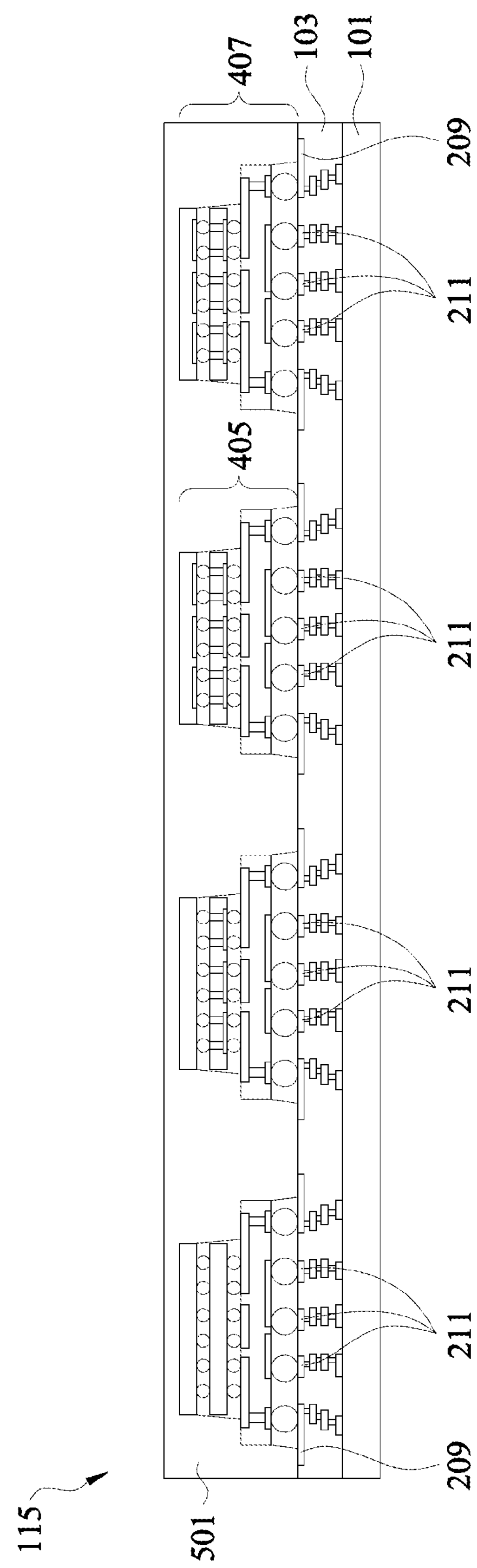
Figure 21:
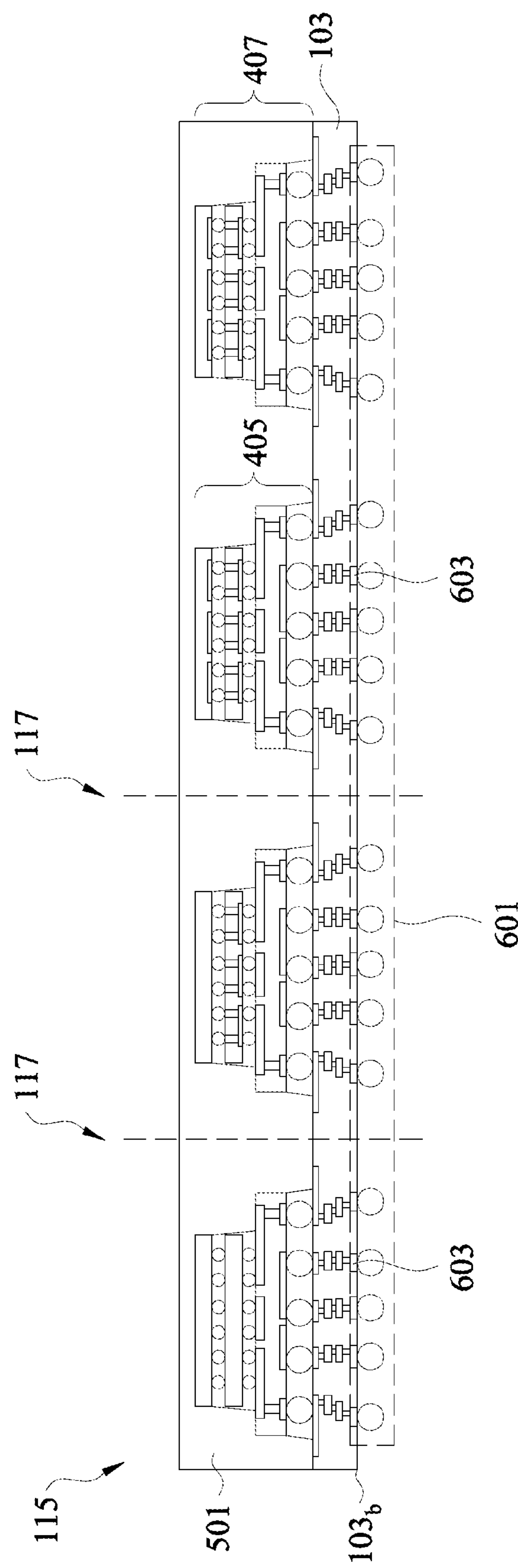

Referring to FIGS. 17-21, there are shown cross-sectional views (along a line AA' in FIGS. 1A and 1B) of the neighboring packages 115 illustrating a yet another method of forming the packages 105 in accordance with some embodiments. In particular, FIGS. 17-21 illustrate an embodiment similar to one discussed above with reference to FIGS. 2-6. In contrast to the embodiments discussed above with reference to FIG. 2-6, in the illustrated embodiment, dummy substrates 1801 are mounted atop the KBPs in order to ensure each of the packages 105 has the same number of dies therein. For example, the FIG. 18 illustrates one of the dummy substrates 1801 mounted atop the first die 201, and the FIG. 19 illustrates one of the dummy substrates 1801 mounted atop the fifth die 301 and two of the dummy substrates 1801 mounted atop the first die 201. In some embodiments, the dummy substrates 1801 are dies and/or interposers that are free of active and passive devices and do not provide additional functionalities to the packages 105. In other embodiments, the dummy substrates 1801 may be known bad dies (KBDs). It may be advantageous to have same number of dies in each of the packages. For example, uniform size of the packages 105 may aid in forming a uniform layer of the molding compound 501 on the substrate 103.

Figure 22:
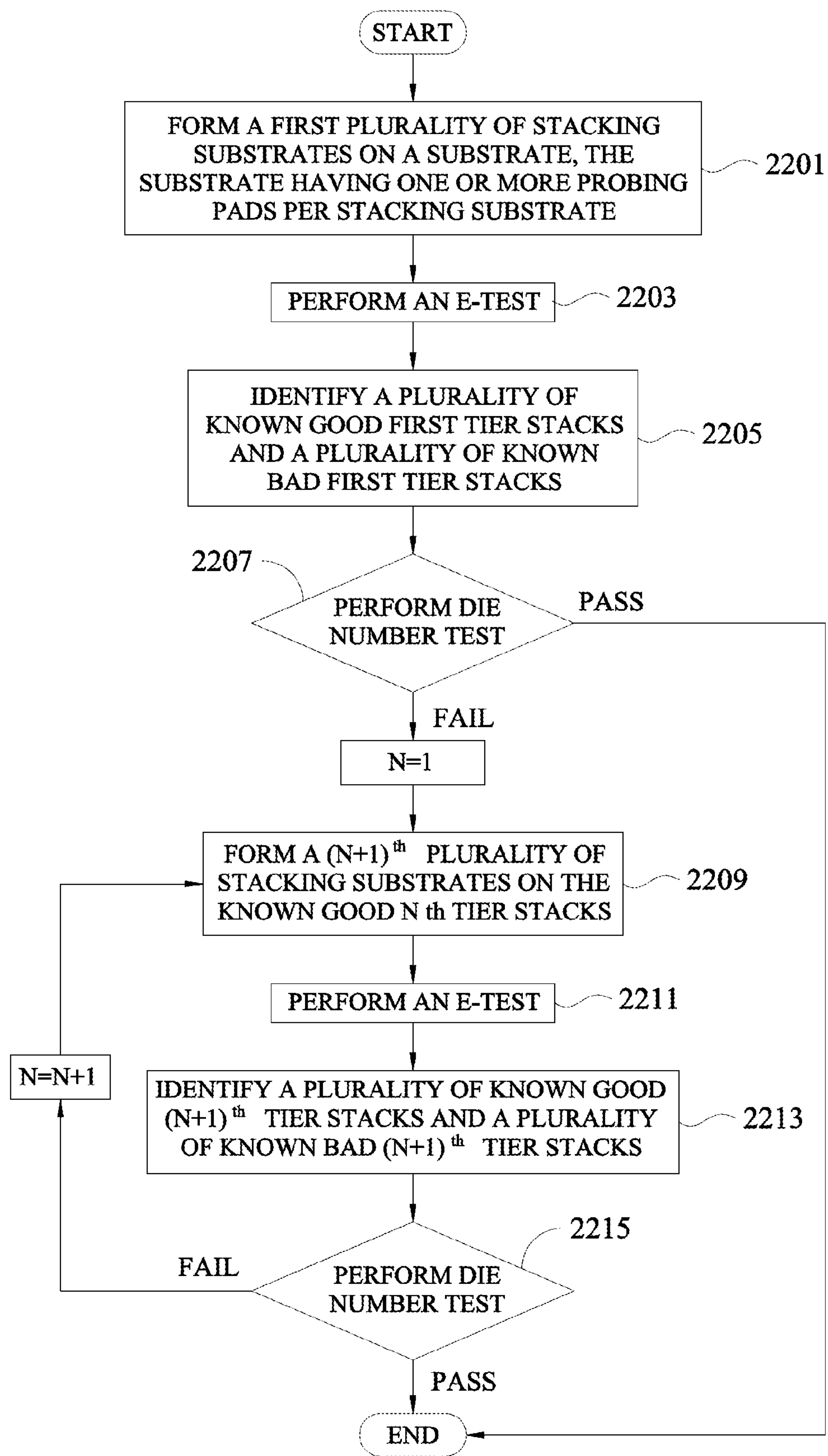
FIG. 22 is a flowchart illustrating a method for forming integrated circuit packages in accordance with some embodiments.

FIG. 22 is a flowchart illustrating a method for forming integrated circuit packages in accordance with some embodiments. The method starts with step 2201, wherein a first plurality of stacking substrates are placed on a substrate, the substrate having one or more probing pads per stacking substrate as discussed above with reference to FIG. 2. In step 2203, an E-test is performed on each of the first plurality of stacking substrates. Depending on results of the E-test, in step 2205, a plurality of known bad first tier stacks are identified, which comprises stacks that failed the E-test as discussed above with reference to FIG. 2. In addition, a plurality of known good first tier stacks are identified, which comprises of stacks that passed the E-test as discussed above with reference to FIG. 2. Subsequently, in step 2207, a die number test is performed on each of known good first tier stacks. If a number of stacking substrates in each of the known good first tier stacks is equal to the desired number that is specified by package design than the method ends at this step. Otherwise, the method continues to step 2209, wherein a second plurality of stacking substrates are mounted on the known good first tier stacks and a plurality of second tier stacks are formed as described above with reference to FIG. 3. In step 2211, an E-test is performed on each of the second tier stacks as discussed above with reference to FIG. 3. Depending on results of the E-test, in step 2213, a plurality of known bad second tier stacks are identified, which comprise of second tier stacks that failed the E-test as discussed above with reference to FIG. 3. In addition, a plurality of known good second tier stacks are identified, which comprise second tier stacks that passed the E-test as discussed above with reference to FIG. 3. Subsequently, in step 2215, a die number test is performed on each of the known good second tier stacks. If a number of dies in each of the known good second tier stacks is equal to the desired number that is specified by package design than the method ends at this step. Otherwise, steps 2209-2215 are repeated one or more times until the desired number of stacking substrates in each of the packages is reached.

In an embodiment, a method for forming integrated circuit packages, the method comprises providing a substrate, and mounting a plurality of first tier stacks to the substrate, wherein the substrate has one or more contact pads corresponding to each of the first tier stacks and has one or more probing pads associated with each of the first tier stacks. The method further comprises electrically testing each of the first tier stacks and identifying known good first tier stacks and known bad first tier stacks, mounting a first plurality of stacking substrates to the known good first tier stacks, thereby forming a plurality of second tier stacks, and electrically testing each of the second tier stacks, and identifying known good second tier stacks and known bad second tier stacks.

In another embodiment, a method for forming integrated circuit packages, the method comprises providing a substrate, the substrate having a first side and a second side, the substrate having a plurality of first contact pads and a plurality of probe pads on the first side, and a plurality of second contact pads on the second side. The method further comprises mounting a plurality of first tier stacks to the first contact pads on the substrate, and electrically testing each of the first tier stacks using the probe pads to identify known good first tier stacks and known bad first tier stacks. The method further comprises mounting a first plurality of stacking substrates to the known good first tier stacks, and mounting a first plurality of dummy substrates to the known bad first tier stacks, thereby forming a plurality of second tier stacks, and electrically testing a subset of second tier stacks using the probe pads, the subset of second tier stacks being those stacks that do not comprise a dummy substrate, and identifying known good second tier stacks and known bad second tier stacks.

In yet another embodiment, a semiconductor device comprises a substrate, the substrate having a first side and a second side opposing the first side, and a first stack on the first side of the substrate, the first stack having a plurality of stacking substrates. The semiconductor device further comprises a probing pad on the first side of the substrate, the probing pad being associated with the first stack, and a contact pad on the second side of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming integrated circuit packages, the method comprising:

mounting a plurality of first tier stacks to a substrate, wherein the substrate has one or more contact pads corresponding to each of the first tier stacks and has one or more probing pads associated with each of the first tier stacks;

electrically testing each of the first tier stacks and identifying known good first tier stacks and known bad first tier stacks;

mounting a first plurality of stacking substrates to the known good first tier stacks, thereby forming a plurality of second tier stacks; and electrically testing each of the second tier stacks, and identifying known good second tier stacks and known bad second tier stacks.

2. The method of claim 1, wherein the plurality of first tier stacks is a plurality of integrated circuit dies.

3. The method of claim 1, wherein the plurality of first tier stacks is a plurality of interposers.

4. The method of claim 1, further comprising mounting a plurality of dummy substrates to the known bad first tier stacks.

5. The method of claim 1, wherein electrically testing each of the first tier stacks comprises testing functionality of each of the first tier stacks.

6. The method of claim 1, further comprising:

mounting a second plurality of stacking substrates to the known good second tier stacks, thereby forming a plurality of third tier stacks, wherein the second plurality of stacking substrates are mounted atop the first plurality of stacking substrates; and electrically testing each of the third tier stacks, and identifying known good third tier stacks and known bad third tier stacks.

7. The method of claim 1, further comprising:

mounting a second plurality of stacking substrates to the known good first tier stacks, thereby forming a plurality of third tier stacks, wherein the second plurality of stacking substrates are mounted adjacent to the first plurality of stacking substrates; and electrically testing each of the third tier stacks, and identifying known good third tier stacks and known bad third tier stacks.

8. A method for forming integrated circuit packages, the method comprising:

mounting a plurality of first tier stacks to a substrate, the substrate having a first side and a second side, the substrate having a plurality of first contact pads and a plurality of probe pads on the first side, the substrate having a plurality of second contact pads on the second side, the plurality of first tier stacks being coupled to the plurality of first contact pads;

electrically testing each of the first tier stacks using the probe pads to identify known good first tier stacks and known bad first tier stacks;

mounting a first plurality of stacking substrates to the known good first tier stacks, and mounting a first plurality of dummy substrates to the known bad first tier stacks, thereby forming a plurality of second tier stacks; and electrically testing a subset of second tier stacks using the probe pads, the subset of second tier stacks being those stacks that do not comprise a dummy substrate, and identifying known good second tier stacks and known bad second tier stacks.

9. The method of claim 8, wherein the plurality of first tier stacks is a plurality of integrated circuit dies.

10. The method of claim 8, wherein the plurality of first tier stacks is a plurality of interposers.

11. The method of claim 8, further comprising:

forming a molding compound over the first side of the substrate; and dicing the substrate along scribe lines to form the integrated circuit packages.

12. The method of claim 8, wherein the first plurality of dummy substrates comprises a known bad stacking substrate.

13. The method of claim 8, further comprising:

mounting a second plurality of stacking substrates to the known good second tier stacks, and mounting a second plurality of dummy substrates to the known bad second tier stacks and the first plurality of dummy substrates, thereby forming a plurality of third tier stacks; and electrically testing a subset of third tier stacks, the subset of third tier stacks being those stacks that do not comprise a dummy substrate, and identifying known good third tier stacks and known bad third tier stacks.

14. The method of claim 13, wherein the second plurality of stacking substrates are mounted atop the first plurality of stacking substrates.

15. The method of claim 13, wherein the second plurality of stacking substrates are mounted adjacent to the first plurality of stacking substrates.

16. A method for forming integrated circuit packages, the method comprising:

mounting a first tier stack to a substrate, wherein the substrate has one or more probing pads associated with the first tier stack;

electrically testing the first tier stack using the one or more probing pads to obtain a first test result;

identifying the first tier stack as a known good first tier stack or a known bad first tier stack based on the first test result;

mounting a first stacking substrate to the first tier stack when the first tier stack is identified as the known good first tier stack, thereby forming a second tier stack;

electrically testing the second tier stack using the one or more probing pads to obtain a second test result;

identifying the second tier stack as a first known good second tier stack or a first known bad second tier stack based on the second test result; and mounting a second stacking substrate to the second tier stack when the second tier stack is identified as the first known good second tier stack, thereby forming a third tier stack.

17. The method of claim 16, further comprising mounting a first dummy substrate to the first tier stack when the first tier stack is identified as the known bad first tier stack, thereby forming a second known bad second tier stack.

18. The method of claim 17, further comprising mounting a second dummy substrate to the second known bad second tier stack.

19. The method of claim 16, wherein further comprising mounting a dummy substrate to the second tier stack when the second tier stack is identified as the first known bad second tier stack.

20. The method of claim 16, wherein the second stacking substrate is mounted adjacent to the first stacking substrate.

* * * * *